United States Patent
Kataoka et al.

(10) Patent No.: US 9,219,497 B2
(45) Date of Patent: Dec. 22, 2015

(54) COMPRESSION DEVICE, COMPRESSION METHOD, AND RECORDING MEDIUM

(71) Applicant: FUJITSU LIMITED, Kawasaki-shi, Kanagawa (JP)

(72) Inventors: Masahiro Kataoka, Tama (JP); Takaki Ozawa, Numazu (JP); Ryo Matsumura, Numazu (JP); Minoru Yamanaka, Fuji (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 14/656,290

(22) Filed: Mar. 12, 2015

(65) Prior Publication Data
US 2015/0188565 A1 Jul. 2, 2015

Related U.S. Application Data

(63) Continuation of application No. PCT/JP2012/005993, filed on Sep. 21, 2012.

(51) Int. Cl.
*H03M 7/00* (2006.01)
*H03M 7/40* (2006.01)
*H03M 7/30* (2006.01)

(52) U.S. Cl.
CPC .............. *H03M 7/40* (2013.01); *H03M 7/3084* (2013.01); *H03M 7/3091* (2013.01)

(58) Field of Classification Search
CPC ............ G06F 17/2735; G06F 17/3061; G06F 17/30985; H03M 7/3088; H03M 7/3086; H03M 7/3084; H03M 7/3079
USPC .......... 341/50, 51, 87, 95, 106, 107; 707/741, 707/758, 769, E17.002
See application file for complete search history.

(56) References Cited

U.S. PATENT DOCUMENTS 5,463,389 A * 10/1995 Klayman .................. 341/51
5,889,481 A 3/1999 Okada
(Continued)

FOREIGN PATENT DOCUMENTS

JP 01-297718 11/1989
JP 05-127865 5/1993
(Continued)

OTHER PUBLICATIONS

International Search Report mailed Oct. 23, 2012 in corresponding international application PCT/JP2012/005993.

*Primary Examiner* — Linh Nguyen
(74) *Attorney, Agent, or Firm* — Staas & Halsey LLP

(57) ABSTRACT

A non-transitory computer-readable recording medium has stored therein a compression program that causes a computer to execute a process. The process includes: reading a plurality of character strings from a compression target file; examining order information whether there are any concatenated character strings that contain a certain character string in the plurality of character strings with an order of the certain character string, in a compression dictionary, the compression dictionary correlating a plurality of concatenated character strings with a plurality of compression codes respectively, each of the plurality of concatenated character strings include a plurality of character strings, the order information indicating whether there is a specific character string in the compression dictionary with an order of the specific character string; and searching the compression dictionary utilizing the plurality of character strings when the order information indicates that one or more concatenated character strings include the certain character string.

9 Claims, 25 Drawing Sheets

(56) References Cited

U.S. PATENT DOCUMENTS

| | | | |
|---|---|---|---|
| 6,169,999 B1* | 1/2001 | Kanno | 715/255 |
| 6,671,856 B1* | 12/2003 | Gillam | 715/210 |
| 6,978,044 B2* | 12/2005 | Akagi | 382/187 |
| 7,167,115 B1* | 1/2007 | Mondal et al. | 341/87 |
| 7,222,067 B2* | 5/2007 | Glushnev et al. | 704/10 |
| 7,256,715 B1* | 8/2007 | Langhammer | 341/51 |
| 2002/0007382 A1* | 1/2002 | Nojima et al. | 707/532 |
| 2002/0059285 A1* | 5/2002 | Fukushima et al. | 707/100 |
| 2007/0096953 A1 | 5/2007 | Odagiri et al. | |
| 2011/0161357 A1 | 6/2011 | Kataoka et al. | |
| 2011/0252062 A1* | 10/2011 | Hanatani et al. | 707/772 |
| 2012/0246600 A1* | 9/2012 | Abe | 715/853 |
| 2012/0284279 A1* | 11/2012 | Shinjo et al. | 707/741 |
| 2013/0297641 A1* | 11/2013 | Shinjo et al. | 707/758 |

FOREIGN PATENT DOCUMENTS

| | | |
|---|---|---|
| JP | 05-224878 | 9/1993 |
| JP | 05-233312 | 9/1993 |
| JP | 05-241777 | 9/1993 |
| JP | 07-152533 | 6/1995 |
| JP | 09-218867 | 8/1997 |
| JP | 2000-036756 | 2/2000 |
| JP | 2003-288288 | 10/2003 |
| JP | 2005-284616 | 10/2005 |
| JP | 2007-124561 | 5/2007 |
| JP | 2011-138230 | 7/2011 |
| JP | 2012-142024 | 7/2012 |
| WO | WO 2012/117544 A1 | 9/2012 |

* cited by examiner

FIG.4

| CHARACTER STRING | NUMBER OF OCCURRENCES |
|---|---|
| ⋮ | ⋮ |
| 川崎市<br>(KAWASAKI-SHI) | 32 |
| ⋮ | ⋮ |
| 東京都<br>(TOKYO-TO) | 48 |
| ⋮ | ⋮ |
| 横浜市<br>(YOKOHAMA-SHI) | 41 |
| ⋮ | ⋮ |
| 中原区<br>(NAKAHARA-KU) | 16 |
| ⋮ | ⋮ |
| 宮前区<br>(MIYAMAE-KU) | 9 |
| ⋮ | ⋮ |
| 神奈川県<br>(KANAGAWA-KEN) | 51 |
| 神奈川区<br>(KANAGAWA-KU) | 1 |
| ⋮ | ⋮ |

| CHARACTER STRING | CODE LENGTH | COMPRESSION CODE | POINTER |
|---|---|---|---|
| ⋮ | ⋮ | ⋮ | ⋮ |
| 川崎市 (KAWASAKI-SHI) | 12 | COMPRESSION CODE C1 OF "川崎市 (KAWASAKI-SHI)" | POINTER P1 |
| ⋮ | ⋮ | ⋮ | ⋮ |
| 東京都 (TOKYO-TO) | 10 | COMPRESSION CODE C2 OF "東京都 (TOKYO-TO)" | POINTER P2 |
| ⋮ | ⋮ | ⋮ | ⋮ |
| 横浜市 (YOKOHAMA-SHI) | 11 | COMPRESSION CODE C3 OF "横浜市 (YOKOHAMA-SHI)" | POINTER P3 |
| ⋮ | ⋮ | ⋮ | ⋮ |
| 中原区 (NAKAHARA-KU) | 15 | COMPRESSION CODE C4 OF "中原区 (NAKAHARA-KU)" | POINTER P4 |
| ⋮ | ⋮ | ⋮ | ⋮ |
| 宮前区 (MIYAMAE-KU) | 16 | COMPRESSION CODE C5 OF "宮前区 (MIYAMAE-KU)" | POINTER P5 |
| ⋮ | ⋮ | ⋮ | ⋮ |
| 神奈川県 (KANAGAWA-KEN) | 10 | COMPRESSION CODE C6 OF "神奈川県 (KANAGAWA-KEN)" | POINTER P6 |
| 神奈川区 (KANAGAWA-KU) | 17 | COMPRESSION CODE C7 OF "神奈川区 (KANAGAWA-KU)" | |
| ⋮ | ⋮ | ⋮ | ⋮ |

| CONCATENATED CHARACTER STRING | NUMBER OF OCCURRENCES |
|---|---|
| ⋮ | ⋮ |
| 神奈川県川崎市宮前区 (KANAGAWA-KEN KAWASAKI-SHI MIYAMAE-KU) | 16 |
| 神奈川県川崎市中原区 (KANAGAWA-KEN KAWASAKI-SHI NAKAHARA-KU) | 32 |
| ⋮ | ⋮ |
| 神奈川県横浜市神奈川区 (KANAGAWA-KEN YOKOHAMA-SHI KANAGAWA-KU) | 18 |
| ⋮ | ⋮ |
| 東京都武蔵野市吉祥寺本町 (TOKYO-TO MUSASHINO-SHI KICHIJOJI HONCHO) | 1 |
| 東京都あきる野市渕上 (TOKYO-TO AKIRUNO-SHI FUCHIGAMI) | 3 |
| ⋮ | ⋮ |

| CONCATENATED CHARACTER STRING | COMPRESSION CODE |
|---|---|
| ⋮ | ⋮ |
| 神奈川県川崎市宮前区 (KANAGAWA-KEN KAWASAKI-SHI MIYAMAE-KU) | COMPRESSION CODE C8 OF "神奈川県川崎市宮前区 (KANAGAWA-KEN KAWASAKI-SHI MIYAMAE-KU)" |
| 神奈川県川崎市中原区 (KANAGAWA-KEN KAWASAKI-SHI NAKAHARA-KU) | COMPRESSION CODE C9 OF "神奈川県川崎市中原区 (KANAGAWA-KEN KAWASAKI-SHI NAKAHARA-KU)" |
| 東京都武蔵野市 (TOKYO-TO MUSASHINO-SHI) | COMPRESSION CODE C10 OF "東京都武蔵野市 (TOKYO-TO MUSASHINO-SHI)" |
| 東京都あきる野市 (TOKYO-TO AKIRUNO-SHI) | COMPRESSION CODE C11 OF "東京都あきる野市 (TOKYO-TO AKIRUNO-SHI)" |
| ⋮ | ⋮ |

| | CHARACTER STRING | ORDER OF CHARACTER STRINGS T2 | | | | | |
|---|---|---|---|---|---|---|---|
| | | 1 | 2 | 3 | 4 | ... | n |
| | ⋮ | ⋮ | ⋮ | ⋮ | ⋮ | ⋮ | ⋮ |
| POINTER P1 → | 川崎市 (KAWASAKI-SHI) | 0 | 1 | 0 | 0 | ... | 0 |
| POINTER P2 → | 東京都 (TOKYO-TO) | 1 | 0 | 0 | 0 | ... | 0 |
| POINTER P3 → | 横浜市 (YOKOHAMA-SHI) | 0 | 1 | 0 | 0 | ... | 0 |
| POINTER P4 → | 中原区 (NAKAHARA-KU) | 0 | 0 | 1 | 0 | ... | 0 |
| POINTER P5 → | 宮前区 (MIYAMAE-KU) | 0 | 0 | 1 | 0 | ... | 0 |
| | ⋮ | ⋮ | ⋮ | ⋮ | ⋮ | ⋮ | ⋮ |
| POINTER P6 → | 神奈川県 (KANAGAWA-KEN) | 1 | 0 | 0 | 0 | ... | 0 |
| | 武蔵野市 (MUSASHINO-SHI) | 0 | 1 | 0 | 0 | ... | 0 |
| | ⋮ | ⋮ | ⋮ | ⋮ | ⋮ | ⋮ | ⋮ |
| | あきる野市 (AKIRUNO-SHI) | 0 | 1 | 0 | 0 | ... | 0 |
| | ⋮ | ⋮ | ⋮ | ⋮ | ⋮ | ⋮ | ⋮ |

FIG.15

| CHARACTER | 1 | 2 | 3 | 4 | 5 |
|---|---|---|---|---|---|
| ⋮ | ⋮ | ⋮ | ⋮ | ⋮ | ⋮ |
| 川 (KAWA) | 1 | 0 | 1 | 0 | 0 |
| 区 (KU) | 0 | 0 | 1 | 1 | 0 |
| 神 (KA) | 1 | 0 | 0 | 0 | 0 |
| 市 (SHI) | 0 | 0 | 1 | 0 | 0 |
| 崎 (SAKI) | 0 | 1 | 0 | 0 | 0 |
| 浜 (HAMA) | 0 | 1 | 0 | 0 | 0 |
| 原 (HARA) | 0 | 1 | 0 | 0 | 0 |
| 前 (MAE) | 0 | 1 | 0 | 0 | 0 |
| 宮 (MIYA) | 1 | 0 | 0 | 0 | 0 |
| 県 (KEN) | 0 | 0 | 0 | 1 | 0 |
| 奈 (NA) | 0 | 1 | 0 | 0 | 0 |
| 横 (YOKO) | 1 | 0 | 0 | 0 | 0 |
| 中 (NAKA) | 1 | 0 | 0 | 0 | 0 |
| ⋮ | ⋮ | ⋮ | ⋮ | ⋮ | ⋮ |

T41

T42

| CHARACTER | ORDER | | | | | | | | | | | |
|---|---|---|---|---|---|---|---|---|---|---|---|---|
| | 1 | 2 | 3 | 4 | 5 | 6 | 7 | 8 | 9 | 10 | 11 | 12 |
| a | 0 | 1 | 0 | 1 | 0 | 1 | 0 | 1 | 0 | 0 | 0 | 0 |
| e | 0 | 0 | 0 | 0 | 0 | 0 | 1 | 0 | 0 | 0 | 1 | 0 |
| g | 0 | 0 | 0 | 0 | 1 | 0 | 0 | 0 | 0 | 0 | 0 | 0 |
| h | 0 | 0 | 0 | 0 | 1 | 0 | 0 | 0 | 0 | 0 | 1 | 0 |
| i | 0 | 1 | 0 | 0 | 0 | 0 | 0 | 0 | 0 | 0 | 0 | 1 |
| k | 1 | 0 | 1 | 0 | 0 | 0 | 1 | 0 | 1 | 1 | 0 | 0 |
| m | 1 | 0 | 0 | 0 | 1 | 0 | 1 | 0 | 0 | 0 | 0 | 0 |
| n | 1 | 0 | 1 | 0 | 0 | 0 | 0 | 0 | 0 | 0 | 0 | 1 |
| o | 0 | 1 | 0 | 1 | 0 | 0 | 0 | 0 | 0 | 0 | 0 | 0 |
| s | 0 | 0 | 0 | 0 | 1 | 0 | 0 | 0 | 0 | 1 | 0 | 0 |
| u | 0 | 0 | 0 | 0 | 0 | 0 | 0 | 0 | 0 | 1 | 1 | 0 |
| y | 1 | 0 | 1 | 0 | 0 | 0 | 0 | 0 | 0 | 0 | 0 | 0 |
| w | 0 | 0 | 1 | 0 | 0 | 0 | 1 | 0 | 1 | 0 | 0 | 0 |
| - | 0 | 0 | 0 | 0 | 0 | 0 | 0 | 1 | 1 | 0 | 0 | 0 |
| r | 0 | 0 | 0 | 0 | 0 | 0 | 1 | 0 | 0 | 0 | 0 | 0 |

COMPRESSION DEVICE, COMPRESSION METHOD, AND RECORDING MEDIUM

CROSS-REFERENCE TO RELATED APPLICATION

This application is a continuation application of International Application No. PCT/JP2012/005993, filed on Sep. 21, 2012 and designating the U.S., the entire contents of which are incorporated herein by reference.

FIELD

The present invention relates to techniques of compressing and decompressing data.

BACKGROUND

A method of allocating a compression code to character information such as characters or words using a compression algorithm such as a Huffman coding or LZ78 to compress the character information is known. In a compression process based on such a compression algorithm, a process of preparing a list of items of character information to which compression codes are allocated, searching the list using character information that matches compression target character information to obtain character information, and generating compressed data using a compression code associated with the character information obtained as the search result is performed.

The searching performed in the compression process is performed by comparing the character information in the list with the compression target character information, and the character information in the list matching the compression target character information is specified as the comparison result. Before comparing with the character information in the list, a range of comparison targets in the list may be narrowed down using an index prepared in advance.

Patent Document 1: Japanese Laid-open Patent Publication No. 2012-142024

Patent Document 2: Japanese Laid-open Patent Publication No. 05-224878

Further, a compression code may be allocated to a combination of character strings such as words to express two or more character strings by one compression code. By doing so, a compression ratio can be improved. However, when a character string read from a compression target file is compressed, searching of a compression code allocated to the character string and searching of a compression code allocated to a combination that includes the character string may be performed redundantly. In particular, the searching of the combination of character strings involves comparing with a combination of character strings to which a compression code is allocated, and the comparison target character string is longer than the unit of character strings to which a compression code is allocated. Thus, the amount of processing needed for the searching increases.

SUMMARY

According to an aspect of the embodiments, a non-transitory computer-readable recording medium has stored therein a compression program that causes a computer to execute a process. The process includes: reading a plurality of character strings from a compression target file; examining order information whether there are any concatenated character strings that contain a certain character string in the plurality of character strings with an order of the certain character string, in a compression dictionary, the compression dictionary correlating a plurality of concatenated character strings with a plurality of compression codes respectively, each of the plurality of concatenated character strings include a plurality of character strings, the order information indicating whether there is a specific character string in the compression dictionary with an order of the specific character string; and searching the compression dictionary utilizing the plurality of character strings when the order information indicates that one or more concatenated character strings include the certain character string.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF DRAWINGS

FIG. 4 illustrates an example of a data structure of an aggregate table T5;

FIG. 5 illustrates an example of a data structure of a character string compression dictionary T1;

FIG. 6 illustrates an example of a data structure of an aggregate table T6;

FIG. 7 illustrates an example of a data structure of a concatenated character string compression dictionary T3;

FIG. 9 illustrates an example of a data structure of the order information table T2;

FIG. 15 illustrates an example of a data structure of an order information table T41;

DESCRIPTION OF EMBODIMENTS

Preferred embodiments will be explained with reference to accompanying drawings.

[a] First Embodiment

Figure 1:
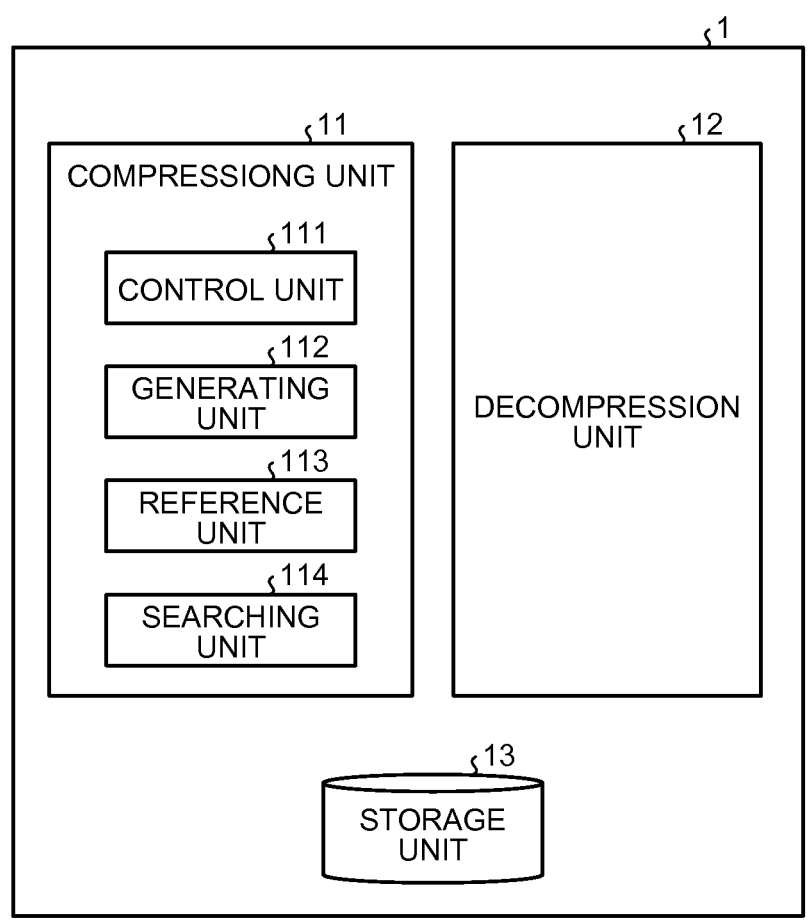
FIG. 1 illustrates an example of a functional configuration of a computer 1.

FIG. 1 illustrates an example of a functional configuration of a computer 1. The computer 1 is a computer that executes a compression process. The computer 1 includes a compression unit 11, a decompression unit 12, and a storage unit 13. If the computer 1 performs a compression process but does not perform a decompression process, the decompression unit 12 may be an optional configuration. The compression unit 11 includes a control unit 111, a generating unit 112, a reference unit 113, and a searching unit 114.

The control unit 111 causes the generating unit 112, the reference unit 113, and the searching unit 114 to execute processes in accordance with a procedure to execute a compression process. The generating unit 112 generates an order information table T2 indicating the order between character strings, for example. The generating unit 112 further generates a character string compression dictionary T1 indicating correspondence between a character string and a compression code, a concatenated character string compression dictionary T3 indicating correspondence between a compression code and a concatenated character string including a plurality of character strings to which a compression code is allocated, and the like, for example. The details of the order information table T2, the character string compression dictionary T1, and the concatenated character string compression dictionary T3 will be described later. Moreover, the generating unit 112 stores the generated character string compression dictionary T1, order information table T2, and concatenated character string compression dictionary T3 in the storage unit 13.

Moreover, the character string compression dictionary T1, the order information table T2, and the concatenated character string compression dictionary T3 may be stored in the storage unit 13 before processes are performed on a compression target file. In this case, the character string compression dictionary T1, the order information table T2, and the concatenated character string compression dictionary T3 are acquired, for example, by reading the same from a communication or portable storage medium and are stored in the storage unit 13. When the character string compression dictionary T1, the order information table T2, and the concatenated character string compression dictionary T3 are stored in advance in the storage unit 13, the generating unit 112 is an optional configuration.

The reference unit 113 acquires order information indicating the order between character strings from the order information table T2 in accordance with the control of the control unit 111. Moreover, the searching unit 114 searches the character string compression dictionary T1 and the concatenated character string compression dictionary T3, for example, in order to find a character string. For example, the searching unit 114 specifies a character string that matches a searching target character string among the character strings included in the character string compression dictionary T1. Moreover, for example, the searching unit 114 specifies a character string that matches a searching target character string among the character strings included in the concatenated character string compression dictionary T3.

The control unit 111 executes the compression process using the processing results of the generating unit 112, the reference unit 113, and the searching unit 114. An example of the compression process executed by the control unit 111 is illustrated in FIG. 2.

Figure 2:
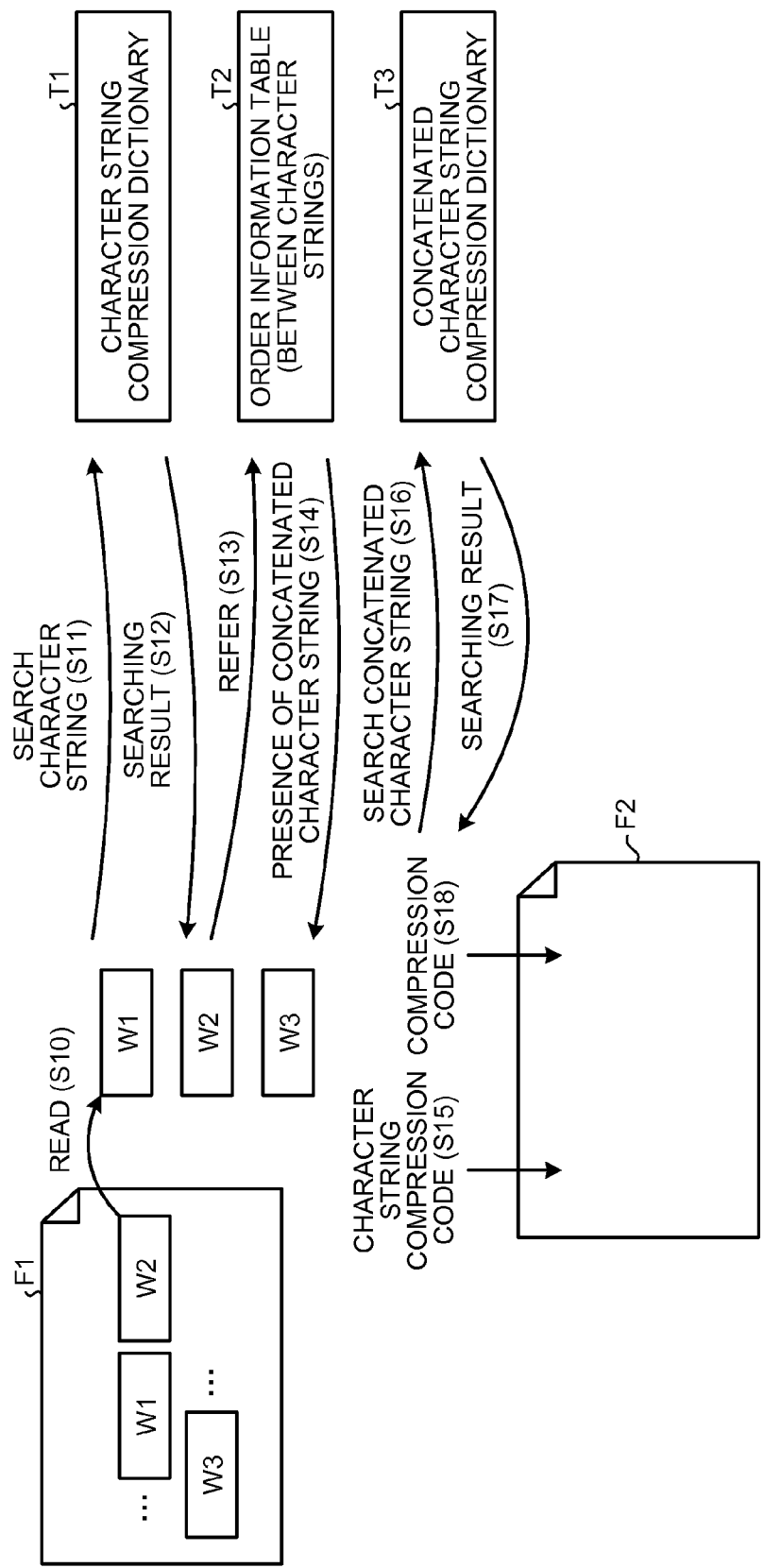
FIG. 2 illustrates an example of a compression process according to a first embodiment.

FIG. 2 illustrates an example of the compression process according to the first embodiment. In FIG. 2, a compression target file F1 is compressed and a compressed file F2 is generated. Details of the respective procedures of the compression process illustrated in FIG. 2 will be described with reference to FIGS. 3 to 13 and the like.

The control unit 111 reads respective character strings sequentially from the compression target file F1 (step S10). In FIG. 2, a character string group (character string W1, character string W2, and character string W3) that is successive in the compression target file F1 is illustrated. The control unit 111 causes the searching unit 114 to execute a searching process using the read character string as a searching target character string sequentially (step S11). In step S11, the searching unit 114 specifies a character string that matches the searching target character string in the character string compression dictionary T1. Moreover, the control unit 111 acquires a searching result from the searching unit 114 (step S12). When it was not possible to specify a character string by searching, a message that a character string that matches the searching target character string is not included in the character string compression dictionary T1 is returned as the searching result. When it was possible to specify the character string by searching, a compression code corresponding to the specified character string is returned as the searching result.

As an example, the character string compression dictionary T1 further indicates correspondence between a compression code and a code length of the compression code. The control unit 111 acquires a code length corresponding to the compression code returned as the searching result and controls a writing position to the compressed file F2 in accordance with the acquired code length. As another example, the character string compression dictionary T1 further indicates correspondence between the character string and a pointer indicating the position of information on the character string in the order information table T2. The control unit 111 uses the pointer corresponding to the character string specified in the searching process in a later-described process (step S13), for example. The character string compression dictionary T1 may include both the code length of the compression code and the pointer indicating the position of the character string in the order information table T2.

When the searching result of the compression code corresponding to the specified character string is received with respect to a plurality of character strings read sequentially, the control unit 111 causes the reference unit 113 to refer to the order information table T2 (step S13). The reference unit 113 determines whether the order of character strings in the plurality of character strings designated from the control unit 111 appears in the order information table T2 and returns a determination result to the control unit 111 (step S14). The order information table T2 is a table indicating the order of each character string in a concatenated character string in a concatenated character string group registered in the concatenated character string compression dictionary T3, for example. That is, the order information table T2 includes information on whether each character string is present as the first character string, the second character string, or the like in any one of the concatenated character strings included in the concatenated character string group. For example, as described above, when the pointer is read from the character string compression dictionary T1, the reference unit 113 may refer to the information on the present of each character string based on the pointer.

Upon receiving a determination result that the order of the plurality of designated character string does not appear in the order information table T2 from the reference unit 113, the control unit 111 writes the compression code received in step S12 for any one of the character string among the plurality of designated character string in the storage unit 13 (step S15). The control unit 111 also controls the writing position to the storage unit 13.

Moreover, when a searching result that a character string that matches the searching target character string is not included in the character string compression dictionary T1 is received, the control unit 111 writes the character string searched by the searching unit 114 to the storage unit 13 (step S15).

Upon receiving a determination result that the plurality of designated character string appears in the order information table T2 from the reference unit 113, the control unit 111 causes the reference unit 113 to cause the searching unit 114 to search the concatenated character string compression dictionary T3 in order to find the plurality of character string determined by the searching unit 114 (step S16). In step S16, the searching unit 114 specifies a concatenated character string that matches the plurality of searching target character strings in the concatenated character string compression dictionary T3. Moreover, the control unit 111 acquires a searching result from the searching unit 114 (step S17). When it was not possible to specify the concatenated character string by searching, a message that a concatenated character string that matches the plurality of searching target character strings is not included in the concatenated character string compression dictionary T3 is returned as a searching result. When it was possible to specify the concatenated character string by searching, a compression code corresponding to the specified concatenated character string is returned as the searching result.

Upon receiving a searching result that a concatenated character string that matches the plurality of searching target character strings is not included in the concatenated character string compression dictionary T3, the control unit 111 writes a compression code received in step S12 for any one character string among the plurality of designated character strings to the storage unit 13 (step S15). On the other hand, when a compression code corresponding to the specified concatenated character string is returned as the searching result, the control unit 111 writes the compression code received in step S17 to the storage unit 13 (step S18).

As described above, in the compression process of the first embodiment, a compression code is allocated to a concatenated character string which is a combination of character strings registered in the character string compression dictionary T1. When the code length of the compression code allocated to the concatenated character string is smaller than the sum of the code lengths of the compression codes allocated to the plurality of character strings included in the concatenated character string, the compression ratio of the concatenated character string is improved.

When a compression code is allocated to the concatenated character string, a character string read from the compression target file F1 may be searched in both the character string compression dictionary T1 and the concatenated character string compression dictionary T3. When the corresponding compression code is found in the searching of the concatenated character string compression dictionary T3, since the compression code obtained as the result of searching the character string compression dictionary T1 is not used, the searching process for the character string compression dictionary T1 may be unnecessary. When the corresponding compression code is not found in the searching of the concatenated character string compression dictionary T3, the searching process itself for the concatenated character string compression dictionary T3 may be unnecessary. Moreover, since the concatenated character string is a combination of a plurality of character strings, the amount of processing needed for the comparison process of determining whether the concatenated character string matches the searching target character string is larger than the amount of processing needed for the comparison process of comparing character strings. As described above, the control unit 111 can suppress the searching of the concatenated character string compression dictionary T3 in accordance with the result of referring to the order information table T2 and suppress an unnecessary searching process.

Moreover, the reference unit 113 can specify a reference target character string included in the order information table T2 by referring to the order information table T2 based on the pointer read from the character string compression dictionary T1. By using the pointer, the reference unit 113 can suppress the searching of the order information table T2 using the reference target character string.

That is, the computer 1 can reduce the amount of processing needed for searching the concatenated character string compression dictionary T3 and maintain the compression speed while improving the compression ratio by allocating the compression code to the concatenated character string.

Hereinafter, the procedure of the compression process according to the first embodiment illustrated in FIG. 2 will be described in more detail by referring to the flowcharts and the data structures illustrated in the drawings.

Figure 3:
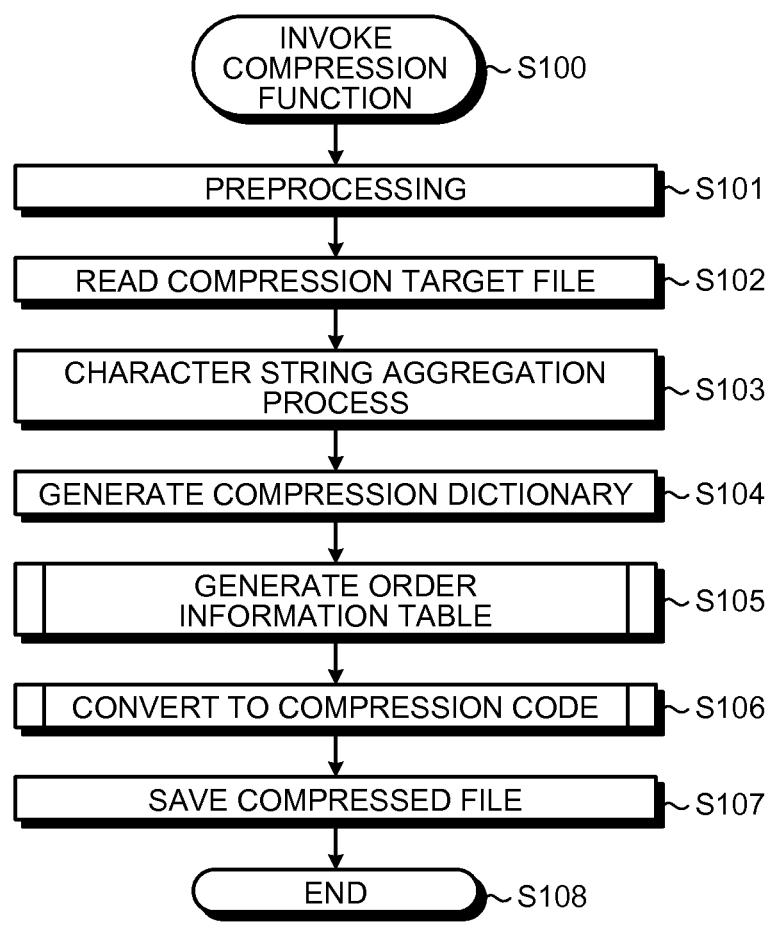
FIG. 3 illustrates an example of a flowchart of the compression process.

FIG. 3 illustrates an example of a flowchart of the compression process. When a compression function is invoked in accordance with an operator's input or a program instruction (step S100), preprocessing of the compression function is performed (step S101). In the process of step S101, the control unit 111 reads a list of character strings to which a compression code is allocated from the storage unit 13 into a work area. The character string is character information that constitutes a unit such as a word or a phrase that includes one or a plurality of characters. Moreover, the character string may be information such as a code or a tag used within the system. The length of the character string may be treated as a fixed length and may be treated as a variable length.

The list of character strings read in step S101 includes a plurality of character strings such as a word or a phrase. A plurality of lists of character strings may be stored in the storage unit 13, and any one of the lists may be selected in accordance with an instruction. In this case, for example, a character string list customized to a field to which the compression target file F1 belongs is prepared. For example, computer-related book data is compressed using a character string list that contains a larger number of computer terms than other character string lists. Moreover, the words and phrases included in the character string list are selected based on a dictionary, for example. For example, a character string list that includes words registered in a computer dictionary, a character string list that includes words registered in a chemistry dictionary, or the like is selected. Moreover, when document data is an address book or the like, a character string list that includes words registered in a place name dictionary, or the like is selected.

Subsequently, the control unit 111 reads the compression target file F1 into a work area (step S102). When the size of the compression target file F1 is too large to read into the work area, the control unit 111 divides the compression target file F1 into blocks and performs the processes of steps S102 to S107 for respective blocks. Subsequently, the control unit 111 performs a process of aggregating the character strings included in the data read in the process of step S102 (step S103).

In step S103, the control unit 111 aggregates the number of occurrences of a combination of a plurality of character strings. In this process, it is applicable that the control unit 111 may only extract a combination of character strings of which the number of occurrences is large.

In the aggregation process of step S103, the number of occurrences in the compression target file F1, of the respective character strings included in the character string list is counted. After the process of step S103 is performed, the control unit 111 allocates a compression code to the respective character strings in accordance with the number of occurrences of each character string to generate the character string compression dictionary T1 (step S104). In step S104, the control unit 111 also allocates a compression code to a combination of a plurality of character strings in accordance with the aggregation result in step S103 to generate the concatenated character string compression dictionary T3. The character string compression dictionary T1 indicates correspondence between the compression code and the character string as described above. The allocation of compression codes based on the number of occurrences of each character string may be performed in accordance with a Huffman tree generation algorithm of Huffman coding or a compression code generation algorithm of arithmetic compression, for example. In the Huffman tree generation algorithm of Huffman coding, codes are allocated in accordance with the order of numbers of occurrences of character strings included in the aggregate table. That is, the larger the number of occurrences of a character string, the shorter the allocated compression code. Moreover, in the arithmetic compression, a compression code having a length corresponding to an occurrence probability of each character string is allocated. In the arithmetic compression, the larger the occurrence probability (the larger the number of occurrences), the shorter the allocated compression code. The control unit 111 stores the respective generated compression codes in the character string compression dictionary T1 in correlation with the character strings. The concatenated character string compression dictionary T3 is generated based on the same algorithm as the character string compression dictionary T1.

FIG. 4 illustrates an example of a data structure of an aggregate table T5. In step S103, the control unit 111 aggregates the respective character strings using the aggregate table T5 illustrated in FIG. 4. The aggregate table T5 indicates correspondence between each character string and the number of occurrences in the compression target file F1, of the character string, for example. The aggregate table T5 may store information indicating the occurrence frequency, for example, rather than the number of occurrences. For example, the respective character strings in the character string list read in step S101 are included in the aggregate table T5. In the example of FIG. 4, character strings such as "川崎市 (Kawasaki-shi)," "東京都 (Tokyo-to)," and "横浜市 (Yokohama-shi)" are included, and the numbers of occurrences aggregated for the respective character strings are correlated with the character strings.

In step S104, the control unit 111 generates the character string compression dictionary T1 based on the aggregate table T5 of FIG. 4. FIG. 5 illustrates an example of a data structure of the character string compression dictionary T1. The character string compression dictionary T1 illustrated in FIG. 5 correlates a character string, a code length, a compression code, and a pointer with each other. The character strings included in the character string compression dictionary T1 include the respective character strings in the character string list read in step S101 similarly to the aggregate table T5. The control unit 111 allocates compression codes to respective character strings based on the aggregation result stored in the aggregate table T5 after the aggregation process of step S103 and stores the compression codes in the character string compression dictionary T1 in correlation with the respective character strings. The control unit 111 also stores the code lengths of the respective compression codes in the character string compression dictionary T1. Although the pointer is also correlated in the character string compression dictionary T1, the pointer is information generated in the process of step S105, the pointer will be described in connection with the process of step S105.

FIG. 6 illustrates an example of a data structure of the aggregate table T6. In step S103, the control unit 111 aggregates the concatenated character string using the aggregate table T6 illustrated in FIG. 6. The aggregate table T6 indicates correspondence between the concatenated character string and the number of occurrences in the compression target file F1, of the concatenated character string, for example. Similarly to the aggregate table T5, the aggregate table T6 may store information indicating the occurrence frequency, for example, rather than the number of occurrences. The concatenated character string in the aggregate table T6 is a plurality of successive character strings included in the compression target file F1, for example.

As an example, it is assumed that the control unit 111 reads a successive character string made up of character strings W1, W2, and W3 from the compression target file F1. The control unit 111 reference targets a concatenated character string CW1 made up of the character strings W1 and W2, a concatenated character string CW2 made up of the character strings W2 and W3, and a concatenated character string CW3 made up of the character strings W1, W2, and W3 in the aggregate table T6. When character strings are read repeatedly, since the number of concatenated character strings registered in the aggregate table T6 increases, the control unit 111 performs a process of eliminating a concatenated character string of which the number of occurrence is smaller than a predetermined number from the aggregate table T6 whenever a predetermined number of character strings are read.

By the aggregation process of the control unit 111, as illustrated in FIG. 6, for example, concatenated character strings such as "神奈川県川崎市宮前区 (Kanagawa-ken Kawasaki-shi Miyamae-ku)" and "神奈川県川崎市宮前区 (Kanagawa-ken Kawasaki-shi Nakahara-ku)" are registered in the aggregate table T6 in correlation with the numbers of occurrences thereof. "神奈川県川崎市宮前区 (Kanagawa-ken Kawasaki-shi Miyamae-ku)" is a concatenated character strings that includes a plurality of character strings "神奈川県 (Kanagawa-ken)," "川崎市 (Kawasaki-shi)," and "宮前区 (Miyamae-ku)".

When the process of step S103 ends, the control unit 111 generates the order information table T2 based on the concatenated character string compression dictionary T3. In the process of step S104, the control unit 111 generates the concatenated character string compression dictionary T3 based on the aggregate table T6 after the aggregation process of step S103. The control unit 111 allocates compression codes to the respective concatenated character strings registered in the aggregate table T6 in accordance with the number of occurrences. The compression codes can be allocated using the same algorithm as that used for generating the character string compression dictionary T1. The control unit 111 may allocate compression codes using the aggregation results of both the aggregate table T5 and the aggregate table T6. Moreover, the control unit 111 may perform allocation of compression codes based on the aggregate table T5 and allocation of compression codes based on the aggregate table T6, separately. In this case, the control unit 111 assigns an identifier indicating whether a compression code is registered in the character string compression dictionary T1 or the concatenated character string compression dictionary T3 to the compression code.

FIG. 7 illustrates an example of a data structure of the concatenated character string compression dictionary T3. In the concatenated character string compression dictionary T3, a concatenated character string is correlated with the compression code allocated to the concatenated character string. The concatenated character string included in the concatenated character string compression dictionary T3 is the concatenated character string registered in the aggregate table T6. Alternatively, the concatenated character string included in the concatenated character string compression dictionary T3 is a portion of the concatenated character strings registered in the concatenated character string compression dictionary T3.

Figure 8:
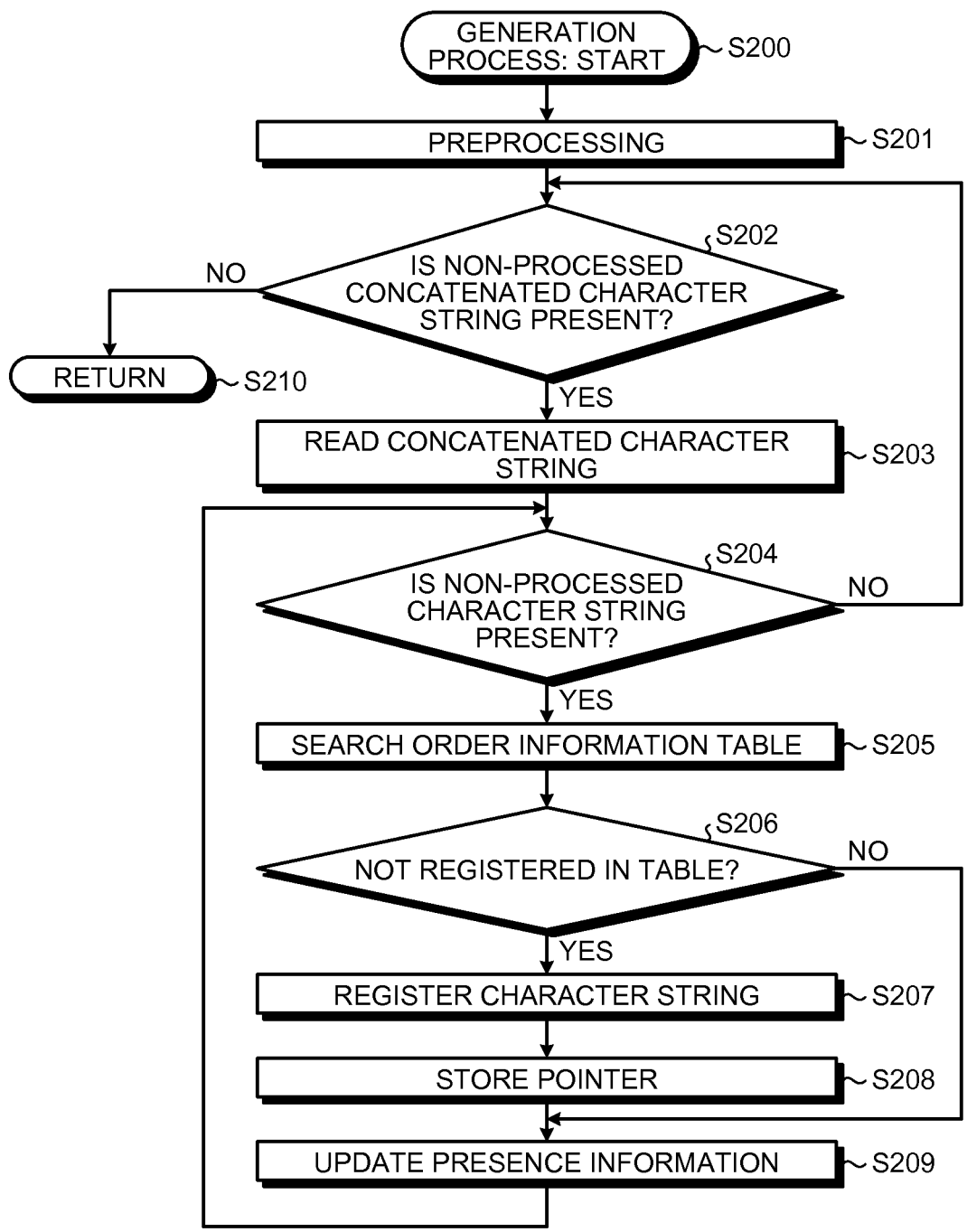
FIG. 8 illustrates an example of a flowchart of a process of generating an order information table T2.

FIG. 3 will be described. When the process of step S104 ends, the control unit 111 causes the generating unit 112 to generate the order information table T2 (step S105). FIG. 8 illustrates an example of a flowchart of a process of generating the order information table T2. Upon receiving an instruction to generate the order information table T2 (step S200), the generating unit 112 performs preprocessing of securing a storage area for storing the order information table T2 in the storage unit 13 (step S201).

FIG. 9 illustrates an example of a data structure of the order information table T2. The order information table T2 indicates correspondence between a character string and the order information of the character string. The order information of a character string is information indicating the order in which the character string appears in a concatenated character string registered in the concatenated character string compression dictionary T3. The order information table T2 illustrated in FIG. 9 includes information indicating whether each of character strings in a concatenated character string is present in any one of the concatenated character strings registered in the concatenated character string compression dictionary T3 for each of the orders (first, second, ..., and n-th) of the character strings in the concatenated character string. In the order information table T2 illustrated in FIG. 9, when one or more of the concatenated character strings registered in the concatenated character string compression dictionary T3 include the character string, "1" indicating "Present" is stored. On the other hand, when none of the concatenated character strings registered in the concatenated character string compression dictionary T3 includes the character string, "0" indicating "Absent" is stored. According to the example of FIG. 9, a concatenated character string that includes the character string "川崎市 (Kawasaki-shi)" as the second character string is registered in the concatenated character string compression dictionary T3. On the other hand, concatenated character strings that include the character string "川崎市 (Kawasaki-shi)" as the first or third character string are not registered in the concatenated character string compression dictionary T3.

In the process of step S201, the storage area is secured in accordance with a predetermined number n indicating up to which order the character string will be treated in the order information table T2. Moreover, the information on the character string in the order information table T2 may be removed after the order information table T2 is generated. This is because the correspondence between the character string and the order information is maintained by the pointer described later.

When the process of step S201 ends, the generating unit 112 determines whether a non-processed concatenated character string is present by referring to the concatenated character string compression dictionary T3 (step S202). When it is determined in step S202 that a non-processed concatenated character string is present (step S202: YES), the generating unit 112 reads the non-processed concatenated character string from the concatenated character string compression dictionary T3 (step S203). When it is determined in step S202 that a non-processed concatenated character string is not present (step S202: NO), the generating unit 112 informs the control unit 111 of the end of the generation process and ends the generation process (step S210).

When the process of step S203 is performed, the generating unit 112 determines whether a non-processed character string is present in the concatenated character strings read in step S203 (step S204). When a non-processed character string is not present (step S204: NO), since the processing on the concatenated character strings read in step S203 has been completed, the generating unit 112 performs the process of step S202 again.

When it is determined in step S204 that a non-processed character string is present (step S204: YES), the order information table T2 is searched using the non-processed character string (step S205). Subsequently, the generating unit 112 determines whether the character string used in the searching of step S205 is not registered in the order information table T2 in accordance with the searching result of step S205 (step S206). When the character string is not registered in the order information table T2 (step S206: YES), the generating unit 112 registers the character string determined to be non-processed in step S204 in the order information table (step S207). Further, the generating unit 112 stores the pointer indicating the storage position of the order information of the character string registered in step S207 in the character string compression dictionary T1 illustrated in FIG. 5 in correlation with the character string registered in step S207 (step S208). In the character string compression dictionary T1 illustrated in FIG. 5, the pointer corresponding to the character string is stored. A pointer is not correlated with some character strings in the character string compression dictionary T1. Such character strings are character strings which are not present in the concatenated character strings registered in the concatenated character string compression dictionary T3.

When the process of step S208 ends or when the character string searched in step S205 is registered in the order information table (step S206: NO), the generating unit 112 updates the order information table T2 based on the character string that is determined to be non-processed in step S204 (step S209). Specifically, the generating unit 112 refers to presence information (indicating "Present" or "Absent") corresponding to the order in the concatenated character string read in step S203, of the character string determined to be non-processed in step S204 within the order information corresponding to the character string determined to be non-processed in step S204. The generating unit 112 updates the referred presence information to "Present". When the presence information indicates "Present," the generating unit 112 does not need to perform the updating. When the updating process of step S209 ends, the generating unit 112 performs the determining process of step S204 again.

When the process of step S105 ends, the control unit 111 performs a process of converting the data included in the compression target file F1 to compression codes based on the character string compression dictionary T1, the concatenated character string compression dictionary T3, and the order information table T2 (step S106). The control unit 111 causes the reference unit 113 and the searching unit 114 to execute processing to perform the conversion process of step S106. In the conversion process of step S106, a storage area for storing the processing results or the like of the reference unit 113 and the searching unit 114 is provided in the storage unit 13.

Figure 10:
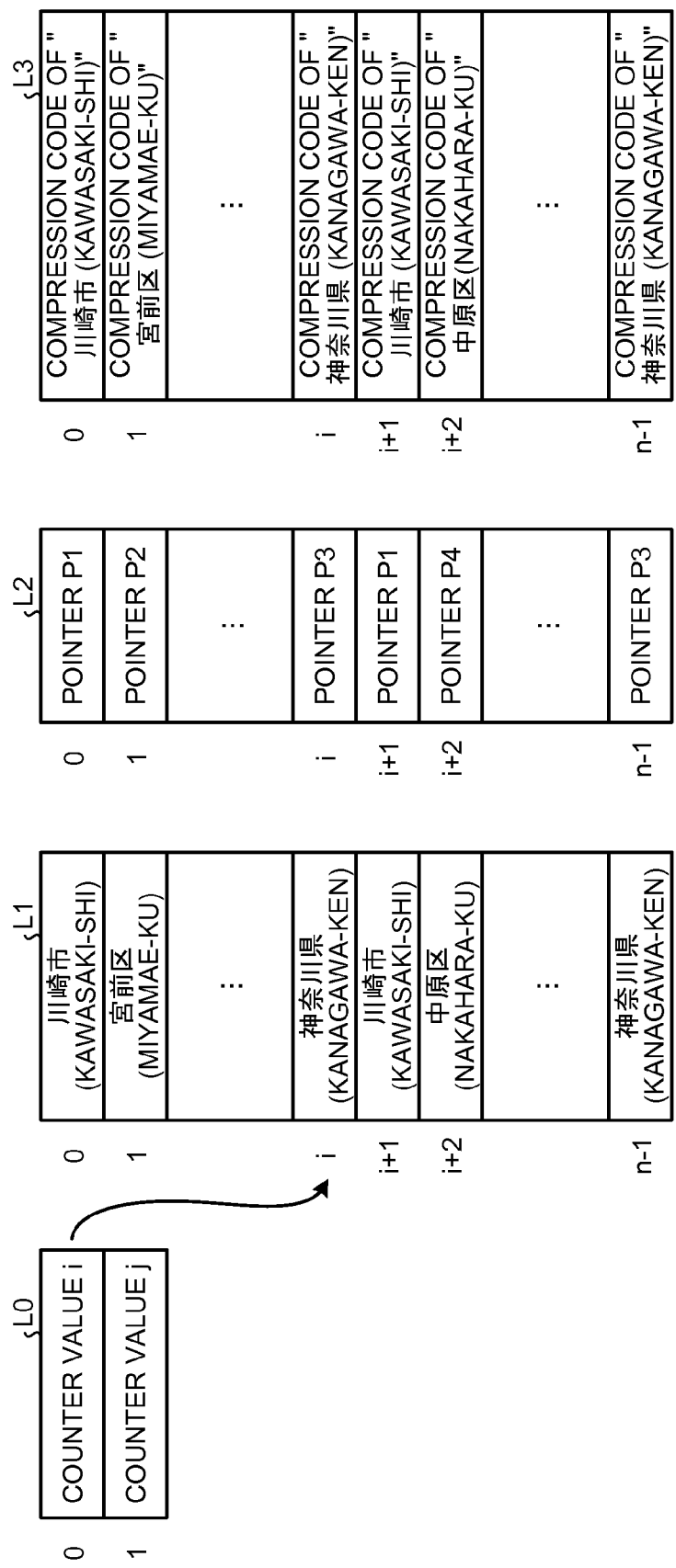
FIG. 10 illustrates an example of a data structure of a storage area in which conversion target data is stored.

FIG. 10 illustrates an example of a data structure of a storage area in which the conversion target data is stored. Storage areas L0, L1, L2, and L3 are illustrated in FIG. 10. The storage areas L1, L2, and L3 are storage areas each capable of storing n items of data, for example, and the storage area L0 is a storage area that stores information (for example, a value of 0 to n−1) capable of identifying the n items of data, for example. In FIG. 10, as an example, a character string is stored in the storage area L1, a pointer is stored in the storage area L2, and a compression code is stored in the storage area L3. By using such a data structure as illustrated in FIG. 10, for example, when a procedure "to acquire i-th data of a storage area" is described in a program, it is possible to access the data of a character string "神奈川県 (Kanagawa-ken)".

The process of step S106 performed by the control unit 111 will be described in detail.

Figure 11:
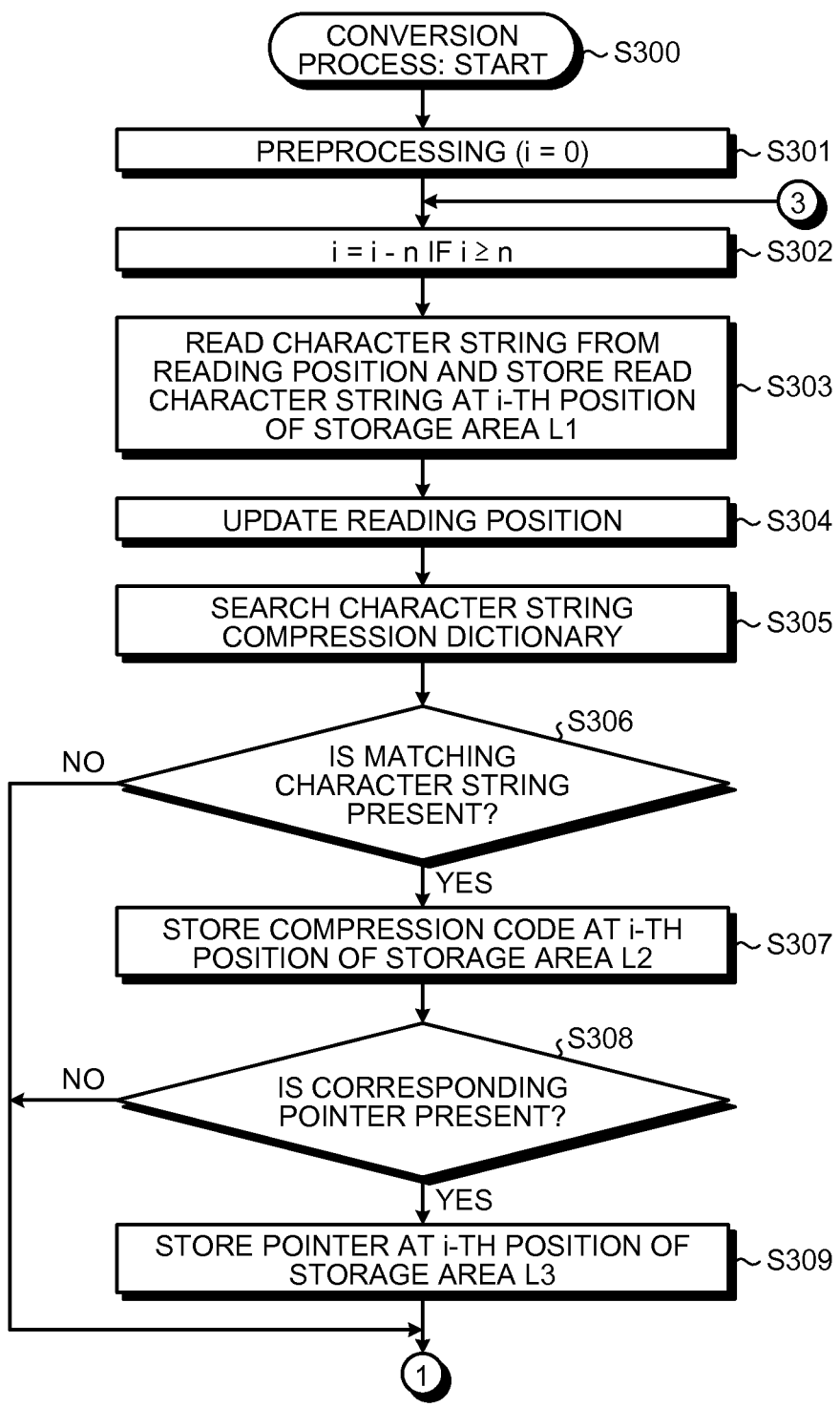
FIG. 11 illustrates an example of a flowchart of a conversion process.
Figure 12:
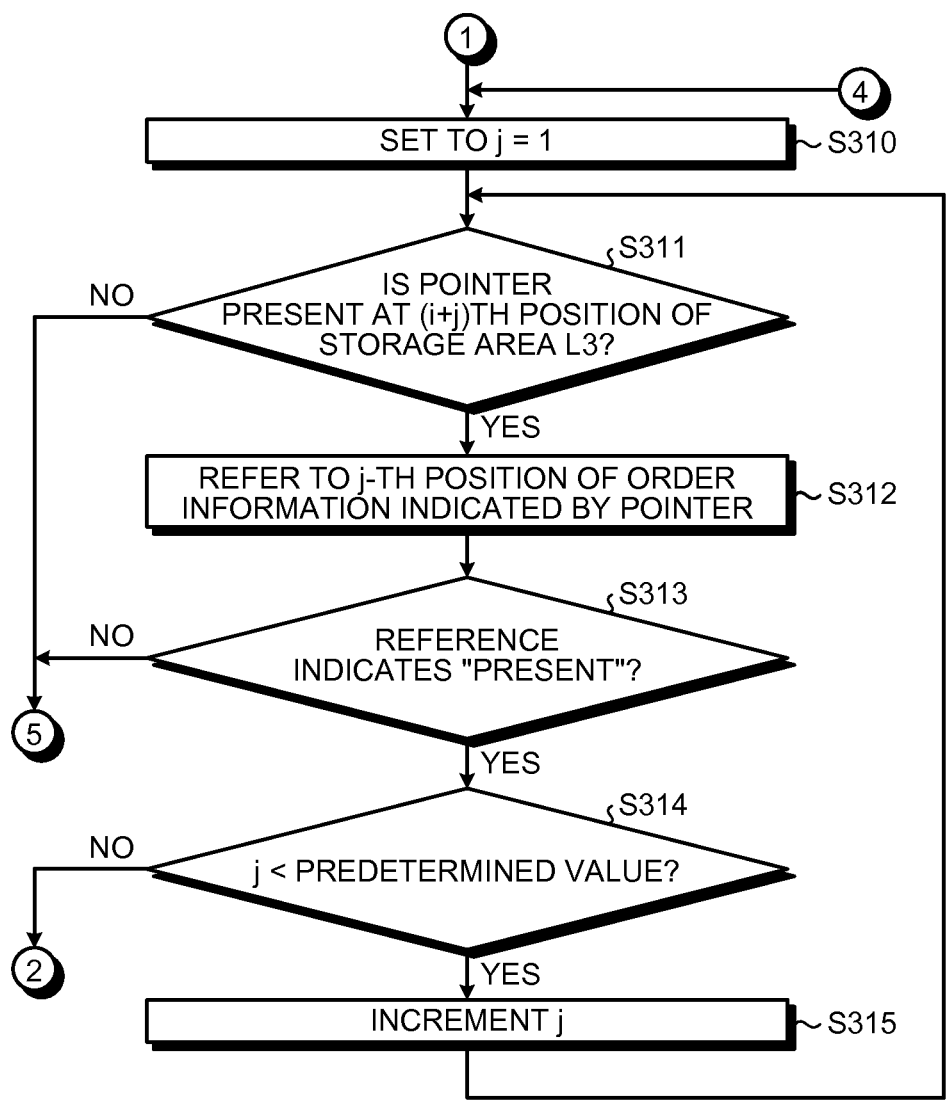
FIG. 12 illustrates an example of a flowchart of a conversion process.
Figure 13:
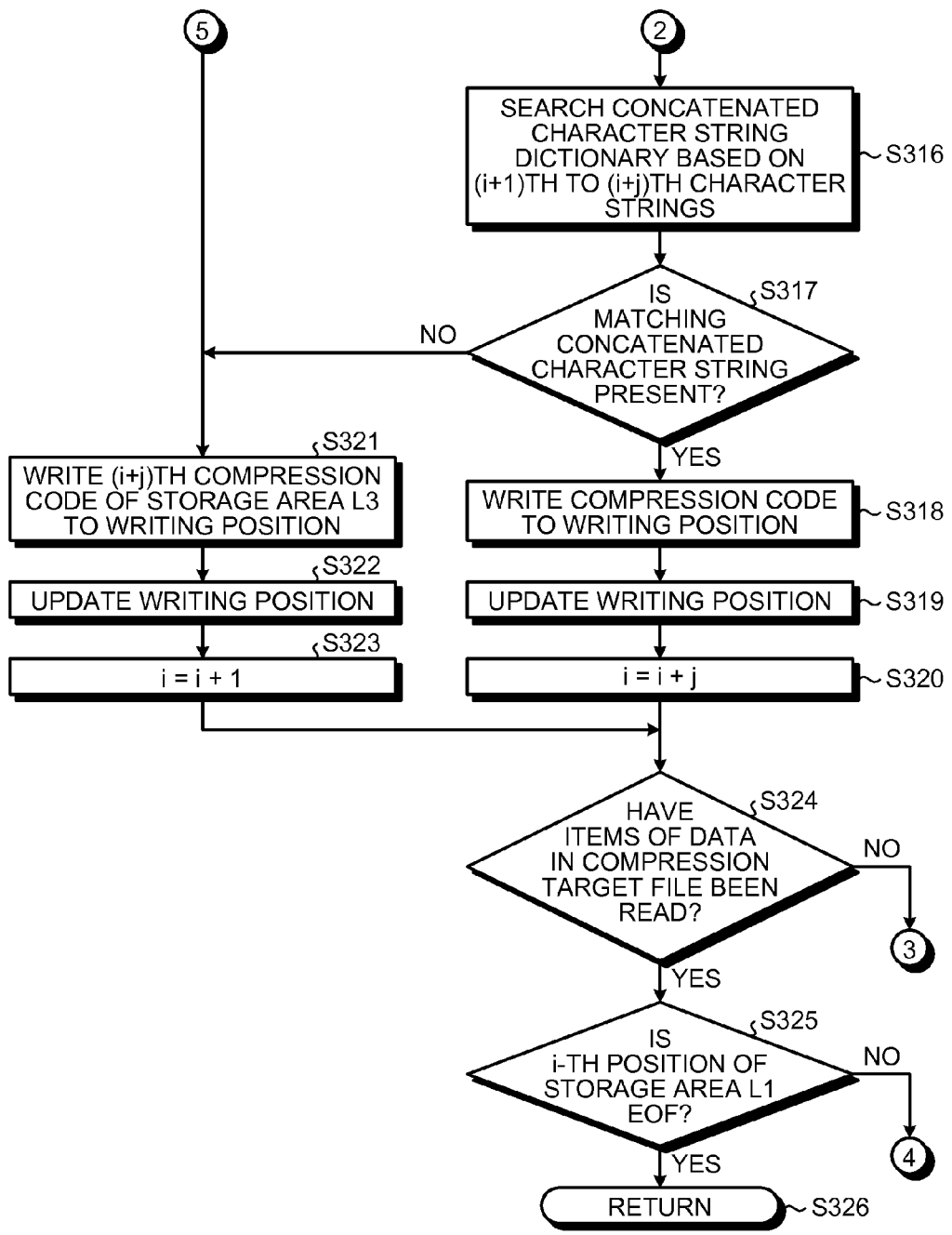
FIG. 13 illustrates an example of a flowchart of a conversion process.

FIGS. 11, 12, and 13 illustrate an example of a flowchart of the conversion process. When the conversion process of step S106 starts (step S300), the control unit 111 executes preprocessing (step S301). Examples of the preprocessing of step S301 include setting the initial value of a counter value i stored in the storage area L0, setting the reading position of a character string from the compression target file F1, and setting the writing position of a compression code to the compressed file F2. The control unit 111 sets i=0 ("=" is an assignment operator), for example. Subsequently, the control unit 111 updates the counter value i (step S302). In step S302, when i is n or more and has a value exceeding the range of the storage areas L1, L2, and L3, the control unit 111 sets i=i−n ("=" is an assignment operator) to update the counter value.

Subsequently, the control unit 111 reads a character string from the designated reading position in the compression target file F1 and stores the read character string at an i-th storage position of the storage area L1 (step S303). When data has been written to the i-th storage position of the storage area L1, the control unit 111 overwrites the read character string. The control unit 111 updates the reading position from the compression target file F1 in accordance with the length of the character string read in step S303 (step S304).

The control unit 111 causes the searching unit 114 to search the character string compression dictionary T1 based on the character string read in step S303 (step S305). The searching unit 114 searches the character string compression dictionary T1 using the character string read in step S303 in accordance with an instruction of the control unit 111 and returns the searching result to the control unit 111. When it is possible to specify a character string that matches the character string read in step S303 in the character string compression dictionary T1, the searching unit 114 designates the compression code corresponding to the specified character string as the searching result. In this case, the pointer correlated with the specified character string may be included in the searching result. On the other hand, when it is not possible to specify the character string that matches the character string read in step S303, the result is returned to the control unit 111 as the searching result.

Subsequently, the control unit 111 determines whether it is possible to specify the character string based on the searching result received from the searching unit 114 (step S306). When the searching unit 114 is able to specify the character string (step S306: YES), the compression code included in the searching result is stored at the i-th storage position of the storage area L2 (step S307). Subsequently, the control unit 111 determines whether the pointer is included in the searching result received from the searching unit 114 (step S308). When the pointer is included in the searching result (step S308: YES), the control unit 111 stores the pointer included in the searching result at the i-th storage position of the storage area L3 (step S309).

Subsequently, when the process of step S309 ends, the control unit 111 sets a counter value j to be stored in the storage area L0 (step S310). When it is determined in step S306 that the searching result that the searching unit 114 is unable to specify the character string is received (step S306: NO), or when it is determined in step S308 that the pointer is not included in the searching result (step S308: NO), the control unit 111 performs the process of step S310. In step S310, j=1 ("=" is an assignment operator) is set.

Subsequently, the control unit 111 determines whether a pointer is stored at the (i+j)th storage position of the storage area L3 (step S311). When the pointer is stored at the (i+j)th storage position of the storage area L3 (step S311: YES), the control unit 111 causes the reference unit 113 to refer to the order information table T2 based on the pointer at the (i+j)th storage position of the storage area L3 (step S312). The pointer at the (i+j)th storage position of the storage area L3 indicates the position in the order information table T2, of the order information of the character string stored at the (i+j)th storage position of the storage area L1. In step S312, the reference unit 113 refers to the presence information of the j-th character string within the order information indicated by the pointer and returns a reference result to the control unit 111.

The control unit 111 determines whether the reference result received from the reference unit 113 indicates "Present" (step S313). When the reference result indicates "Present" (step S313: YES), the control unit 111 determines whether the counter value j is smaller than a predetermined value (step S314). When the counter value j is smaller than the predetermined value (step S314: YES), the control unit 111 increments the counter value j (step S315) and performs the process of step S311 again. The predetermined value may be a unique value and may be a value designated before a compression instruction is issued. With the determination of step S314, the concatenated character string compression dictionary T3 is searched only when a predetermined number or more of successive character strings match the order information.

When the pointer is not present at the (i+j)th storage position of the storage area L3 (step S311: NO), or when the reference result indicates "Absent" (step S313: NO), the control unit 111 performs the process of step S321. The process of step S321 will be described later. When the counter value j is a predetermined value or more (step S314: NO), the control unit 111 performs the process of step S316. In step S316, the control unit 111 causes the searching unit 114 to search the concatenated character string compression dictionary T3 based on the character strings stored at the (i+1)th to (i+j)th storage positions of the storage area L1 (step S316). The searching unit 114 searches the concatenated character string compression dictionary T3 based on a concatenated character string made up of successive character strings stored at the (i+1)th, (i+2)th, . . . , and (i+j)th storage positions of the storage area L1. The searching unit 114 returns the searching result for the concatenated character string compression dictionary T3 to the control unit 111. When it is possible to specify a concatenated character string that matches the concatenated character string instructed by the control unit 111 in the concatenated character string compression dictionary T3, the searching unit 114 designates a compression code correlated with the specified concatenated character string as the searching result. Moreover, when it is not possible to specify a concatenated character string that matches the concatenated character string instructed by the control unit 111 in the concatenated character string compression dictionary T3, the searching unit 114 designates the result as the searching result.

The control unit 111 determines whether a concatenated character string made up of the character strings stored at the (i+1)th to (i+j)th storage positions of the storage area L1 is included in the concatenated character string compression dictionary T3 based on the searching result received from the searching unit 114 (step S317). When the searching result is a compression code, the control unit 111 determines that a character string that matches the concatenated character string made up of the character strings stored at the (i+1)th to (i+j)th storage positions of the storage area L1 is included in the concatenated character string compression dictionary T3 (step S317: YES). In this case, the control unit 111 writes the compression code included in the searching result to the writing position of the compressed file F2 (step S318). Further, the control unit 111 updates the writing position based on the code length of the compression code written in step S318 (step S319) and updates the counter value i (step S320). The counter value i is updated in step S320 by the control unit 111 assigning a value to i=i+j ("=" is an assignment operator) and the counter value i.

When the searching result indicates that it is not possible to specify a concatenated character string that matches the concatenated character string instructed for searching in the concatenated character string compression dictionary T3, the control unit 111 determines that a matching concatenated character string is not present in the concatenated character string compression dictionary T3 (step S317: NO). In this case, the control unit 111 writes the compression code stored at the (i+1)th storage position of the storage area L3 to the writing position of the compressed file F2 (step S321). In step S321, when the compression code is not stored at the (i+1)th storage position of the storage area L3, the control unit 111 writes the character string stored at the (i+1)th storage position of the storage area L1, for example. Alternatively, the control unit 111 writes the character string stored at the (i+1)th storage position of the storage area L1 after compressing the character string based on another compression algorithm. After the process of step S321 is performed, the control unit 111 updates the writing position in accordance with the code length of the compression code written in step S321 (step S322) and increments the counter value i (step S323). The control unit 111 performs the updating of step S322 in accordance with the length of the written character string when the character string was written in step S321 and performs the updating of step S322 in accordance with the code length of the compression code when the compression code generated by another compression algorithm is written in step S321.

When the counter value i is updated in step S320 or step S323, the control unit 111 determines whether all items of the data in the compression target file F1 have been read (step S324). When non-read data is present in the compression target file F1 (step S324: NO), the control unit 111 executes the process of step S302 again. Moreover, when all items of the data in the compression target file F1 have been read (step S324: YES), the control unit 111 determines whether EOF (an end-of-file identifier) is stored at the i-th storage position of the storage area L1 (step S325). When the information stored at the i-th storage position of the storage area L1 is not EOF (step S325: NO), the control unit 111 performs the process of step S310 again. When the information stored at the i-th storage position layout of the storage area L1 is EOF (step S325: YES), the conversion process ends, and the flow returns to the flowchart of FIG. 3 (step S326).

When the process of step S106 is executed, the control unit 111 saves the compressed file F2 (step S107). In the process of step S107, for example, the control unit 111 displays a screen in which a file name and a file storage position are designated and stores a compressed file by a designated file name at a designated file storage position in accordance with the input entered in the displayed screen. When the compressed file is saved, the invoked compression function is closed (step S108).

[b] Second Embodiment

A compression process according to a second embodiment is also performed by the computer 1 illustrated in FIG. 1.

Figure 14:
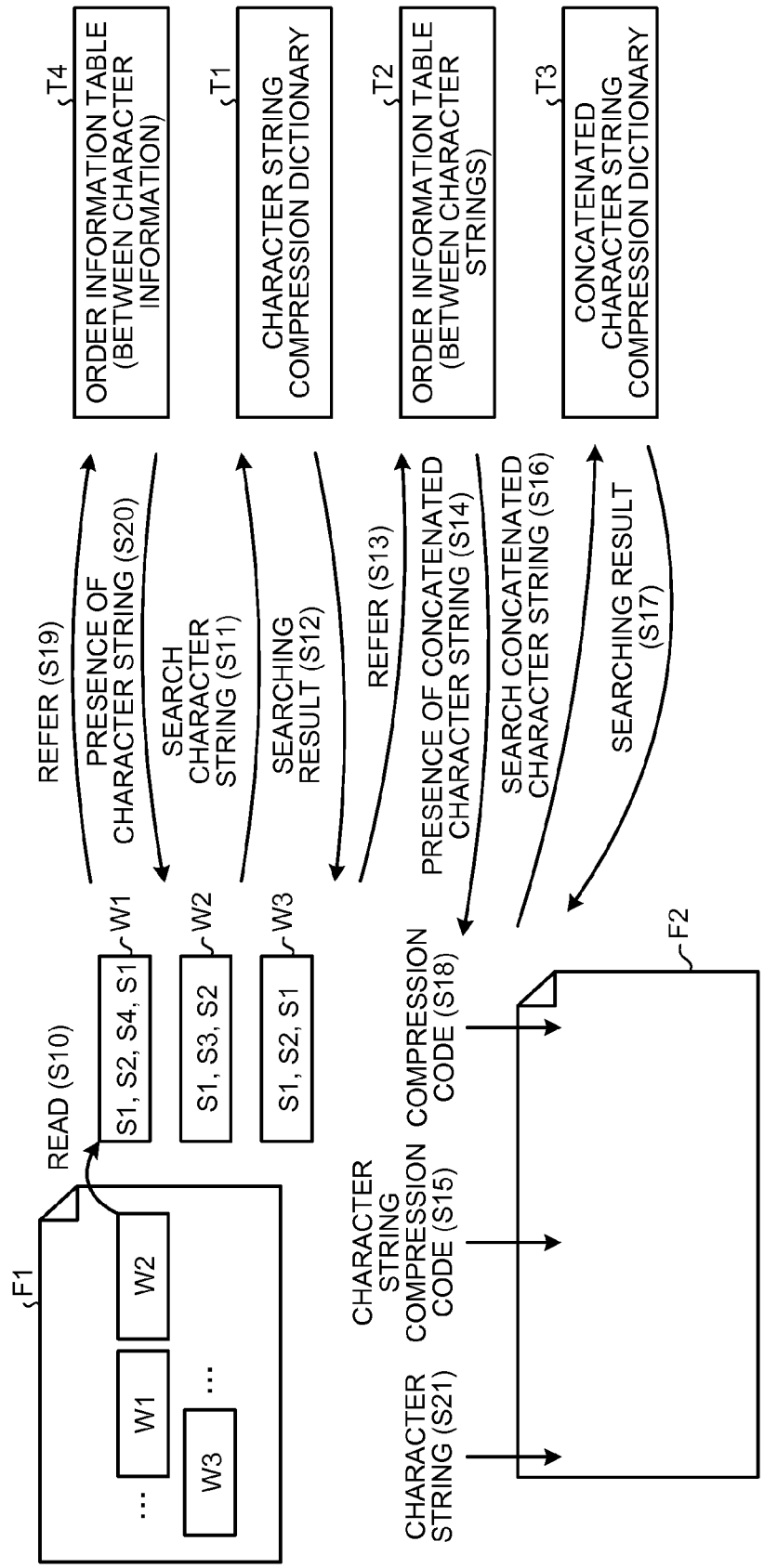
FIG. 14 illustrates an example of a compression process according to a second embodiment.

FIG. 14 illustrates an example of the compression process according to the second embodiment. In the second embodiment, the control unit 111 refers to the order information table T4 before searching the character string compression dictionary T1 using the read character string (step S19) and suppresses searching of the character string compression dictionary T1 in accordance with the reference result (step S20). In this way, unnecessary searching of the character string compression dictionary T1 is suppressed. When searching of the character string compression dictionary T1 is suppressed, the control unit 111 writes the read character string to the compressed file F2 (step S21). Instead of writing the character string in step S21, the read character string may be compressed using another compression algorithm and be written to the compressed file F2. When the character string compression dictionary T1 is searched, the same compression process as the first embodiment is performed.

The order information table T4 is a table generated based on the character string compression dictionary T1, on which the order of the character information in each character string included in the character string compression dictionary T1 is reflected. The order information table T4 includes the record of each type of character information. Each record indicates the order of the character information corresponding to the record in the character string included in the character string compression dictionary T1. More specifically, each record has an item for each order indicating whether the character information is present as the first character information, the second character information, or the like in the character string. "Present" appears in each item when the character information corresponds to one or more of the character strings included in the character string compression dictionary T1 and "Absent" appears in the item when the character information does not correspond to any character string.

FIG. 15 illustrates an example of a data configuration of an order information table T41 of Japanese notations as an example of the order information table T41. In the order information table T41, a record is provided for each item of character information such as "川 (kawa)," "区 (ku)," and the like. Further, each record includes an item corresponding to each position (first character, second character, or the like) in the character string. For example, in the record of "川 (kawa)," "Present (1)" appears in the item of the first character and "Absent (0)" appears in the item of the second character. According to this example, the character string compression dictionary T1 includes a character string including "川 (kawa)" in the first character but does not include a character string including "川 (kawa)" in the second character.

In the referring (step S19) of the order information table T4 illustrated in FIG. 14, the order information table T4 is referred to based on a portion or all of the items of character information in the read character string. For example, when the order information table T41 is referred to based on a character string "川崎市 (Kawasaki-shi)," "Present" appears in the item of the first character of the record of the character information "川 (kawa)," "Present" appears in the item of the second character of the record of the character information "崎 (saki)," and "Present" appears in the item of the third character of the record of the character information "市 (shi)". In the case of this reference result, since there is a possibility that "川崎市 (Kawasaki-shi)" is included in the character string compression dictionary T1, the control unit 111 does not suppress the searching (step S11) of the character string compression dictionary T1. On the other hand, for example, in the case of the character string such as "市原市 (Ichihara-shi)," "Absent" appears in the item of the first character of the record of the character information "市 (shi)". Due to this, in the case of this reference result, since it is obvious that "市原市 (Ichihara-shi)" is not included in the character string compression dictionary T1, the control unit 111 suppresses the searching (step S11) of the character string compression dictionary T1.

Figures 16, 17:
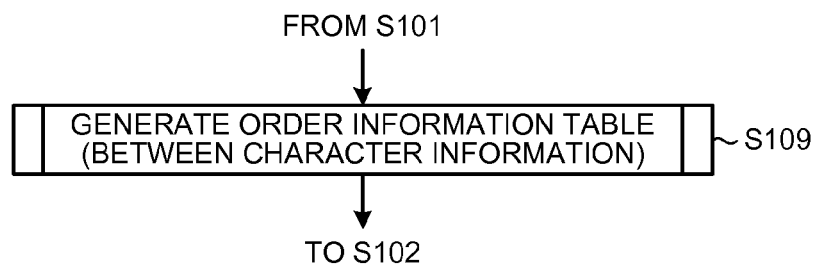
FIG. 16 illustrates an example of a data structure of an order information table T42.
FIG. 17 illustrates an example of a flowchart of a compression process according to the second embodiment.

FIG. 16 illustrates an example of a data configuration of an order information table T42 of Japanese notations as an example of the order information table T4. In the example of the data configuration of the order information table T42, a record is provided for each item of character information such as "a," "e," and the like. Further, each record includes an item corresponding to each position (first character, second character, or the like) in the character string. For example, in the record of "a," "Present (1)" appears in the item of the second character and "Absent (0)" appears in the item of the third character. According to this example, the character string compression dictionary T1 includes a character string including "a" in the second character and does not include a character string including "a" in the third character. For example, the character string compression dictionary T1 may include "man" but does not include "sea".

In the first embodiment, addresses were used as examples of the character strings in the character string compression dictionary T1 and the concatenated character strings in the concatenated character string compression dictionary T3. When an address is expressed in Japanese, a place name indicating a wider region appears first, successively followed by place names indicating narrower regions. The place name indicating a wider region is used in succession with a plurality of place names indicating narrow regions. For example, a place name indicating a wider range "東京都 (Tokyo-to)" is used in combination with "あきる野市 (Akiruno-shi)" or "武蔵野市 (Musashino-shi)" which is a place name indicating a narrow range. That is, concatenated character strings "東京都あきる野市 (Tokyo-to Akiruno-shi)" and "東京都武蔵野市 (Tokyo-to Musashino-shi)" are present.

Unlike the above example, when an address is expressed in English, a place name indicating a narrow region appears first, followed by place names indicating wider regions. That is, in English notations of addresses, a subsequent character string in a concatenated character string is combined in common with a plurality of character strings. In the above example, "Tokyo-to" is combined with "Akiruno-shi" and "Musashino-shi". Thus, the concatenated character string is expressed as "Akiruno-shi, Tokyo-to" or "Musashino-shi, Tokyo-to".

In the order information table based on the English notation example, "Present" appears in the second order for the character string "Tokyo-to" and "Present" appears in the first order for the character strings "Akiruno-shi" and "Musashino-shi".

For example, although a method of storing a concatenated character string in the order information table T4 as one long character string may be used, the size of the order information table T4 may increase because a long character string has to be stored. Moreover, a character string such as the English notation of addresses described above, which is combined in common with a plurality of character strings, does not appear at the beginning of a concatenated character string, since the beginning character strings have different lengths, the position of the character string used in common changes. Thus, since the number of part of strings determined to be "present" increases due to the character string used in common, it may be difficult to obtain the suppression effect which is obtained by referring to the order information table T4.

Hereinafter, the compression process of the second embodiment will be described in further detail.

The generating unit 112 included in the computer 1 illustrated in FIG. 1 generates the order information table T4 indicating the order between items of character information as well as the order information table T2, the character string compression dictionary T1, and the concatenated character string compression dictionary T3, for example. The generating unit 112 stores the generated order information table T4 in the storage unit 13. The reference unit 113 refers to the order information table T2 and the order information table T4 in accordance with an instruction of the control unit 111. The control unit 111 suppresses the searching process of the searching unit 114 in accordance with the reference results of the order information table T2 and the order information table T4.

FIG. 17 illustrates an example of a flowchart of the compression process according to the second embodiment. In the second embodiment, in the flowchart illustrated in FIG. 3, after the process of step S101 is performed, the control unit 111 generates the order information table T4 (step S109). When the order information table T4 is generated, the control unit 111 returns to the flow of step S102 illustrated in FIG. 3. The details of the process (step S109) of generating the order information table T4 will be described with reference to FIG. 18.

Figure 18:
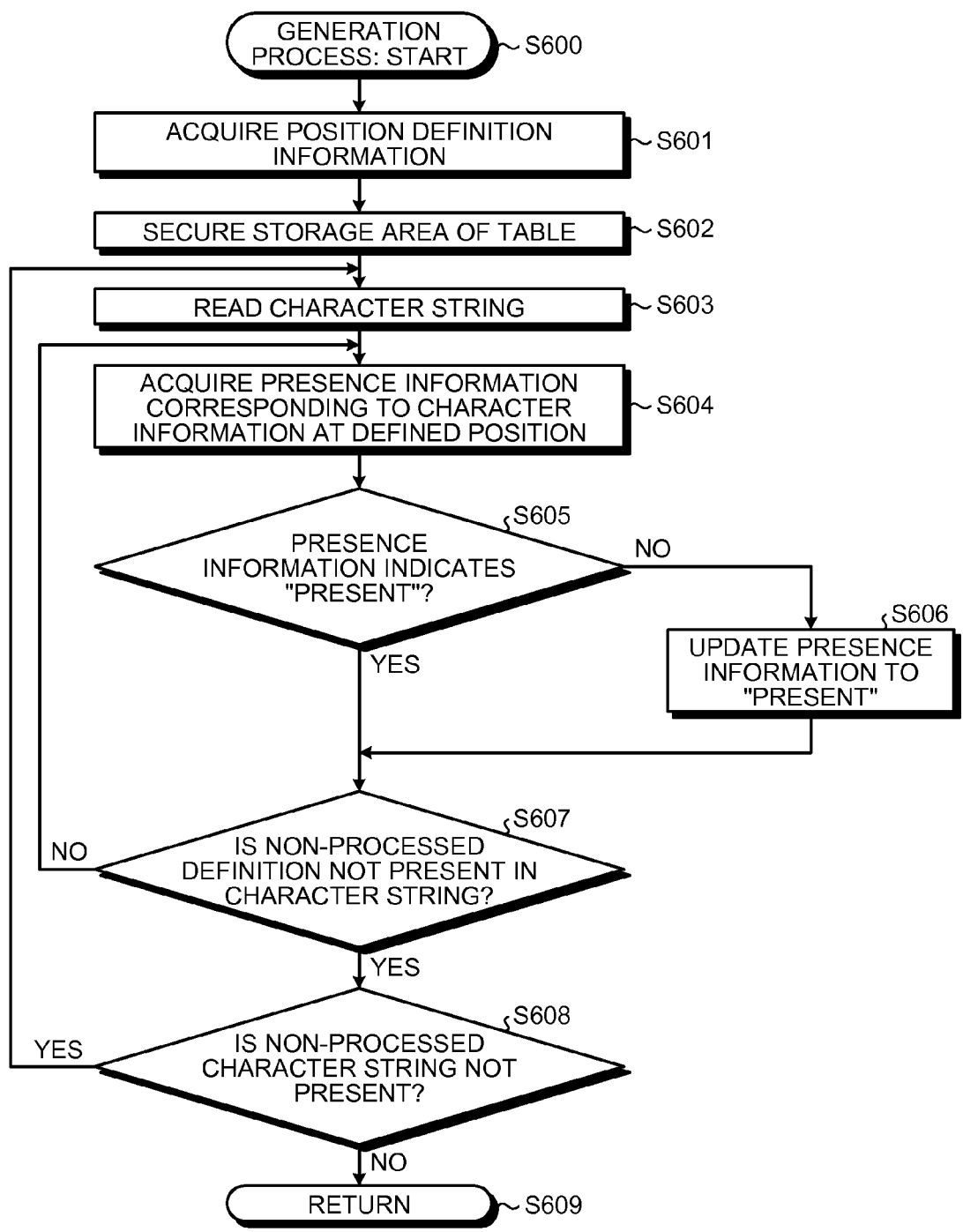
FIG. 18 illustrates an example of a flowchart of a generation process.

FIG. 18 illustrates an example of the flowchart of the generation process. When a process of generating the order information table T4 is invoked (step S600), the control unit 111 reads definition information on the position in a character string (step S601). The definition information includes a definition that designates a certain number of characters (the length of character information) from a certain character (starting position) in a character string, for example. According to an example of the definition, "one character" from "first character" is designated. Moreover, the definition information may include one or a plurality of definitions. As an example of the definition information, definition information including a definition that designates "one character" from "first character," a definition that designates "one character" from "second character," a definition that designates "one character" from "third character," and a definition that designates "one character" from "fourth character" may be used. Moreover, the starting position and the length of the character information included in each definition are designated by counting a number from the beginning of a character string, the end of the character string, or an optional position of the characters.

Subsequently, the control unit 111 secures a storage area for storing the order information table T4 in the storage unit 13 (step S602). In the process of step S602, the control unit 111 initializes the presence information included in the order information table T4 to information indicating "Absent".

The order information table T4 includes an item corresponding to each definition included in the definition information acquired in step S601, for example. Due to this, for example, the order information table T4 includes a number of items corresponding to at least the number of definitions included in the definition information. Since each item represents information "Present" or "Absent," data of one bit or more is included (for example, each field include one bit, representing "Present" by "1" and "Absent" by "0"). Moreover, for example, the order information table T4 has a number of records corresponding to the number of types of character information. The number of types of character information is determined, for example, by the number of types of character codes included in a character code system used and the length of character information defined by the definition information acquired in step S601. The number of types of character information is an exponentiation of the number of types of character codes included in the character code system by the length of the character information. Moreover, for example, the starting position of each record corresponding to each character information is indicated by the character information itself.

The size of the order information table T4 and the starting position of the record corresponding to the character information will be described by way of an example of an ASCII code system. Each character code of the ASCII code system is represented by one byte. In the definition information, when the length of character information is defined by "two characters," the character information is expressed by 2 bytes. As an example, when a region of 1 byte is secured for each record, the starting position of a record of order information for character information represented by 2 bytes is specified by a number corresponding to 2-byte character information from the starting position of the order information table T4. For example, an ASCII code corresponding to the character information "AA" is 0x4141 and is "16705" in a decimal number. That is, the starting position of a record of order information for the character information "AA" is specified by the position of 16705 bytes from the starting position of the order information table T4. In the above example, it is assumed that the size of each record is 1 byte, and in this case, with 1 byte, it is possible to cope with definition information which includes eight definitions. Moreover, the size of the order information table T4 in the above example is stored in a storage area having the size (=64 KB) of an exponentiation of 2 by 16. However, the ASCII code system uses codes of 0x00 to 0x7F and does not use character codes corresponding to 0x80 to 0xFF. Practically, in the above example, the storage area used by the order information table T4 is sufficient with 16 KB which is ¼ of 64 KB.

When the storage area of the order information table T4 is secured in the process of step S602, the control unit 111 reads character strings sequentially from the character string list read in the work area in step S101 of FIG. 3 (step S603). When the process of step S603 is performed, the control unit 111 causes the reference unit 113 to refer to the order information table T4. The reference unit 113 selects a non-processed definition among the definitions acquired in step S601 and refers to the order information table T4 using the selected definition to acquire presence information (step S604). The reference unit 113 acquires presence information of character information positioned at the position indicated by the selected definition within the character string read in step S603. The reference unit 113 determines whether the acquired presence information represents "Present" (step S605). When the acquired presence information represents "Absent" (step S605: NO), the reference unit 113 updates the presence information of the position of the order information table T4 to "Present" (step S606). When the presence information acquired in step S604 represents "Present" (step S605: YES) or when the process of step S606 is performed, it is determined whether a non-processed definition is present (step S607). When it is determined in step S607 that a non-processed definition is not present (step S607: NO), the process of step S604 is performed again based on the non-processed definition.

When the reference process is performed for the character string read in step S603 using the respective definitions included in the definition information (step S607: YES), the control unit 111 determines whether a non-processed character string is present in the character string list (step S608). When it is determined in step S608 that a non-processed character string is present (step S608: NO), the flow returns to step S603 and the control unit 111 reads a non-processed character string again. When it is determined in step S608 that a non-processed character string is not present (step S608: YES), the control unit 111 performs the process of step S102 of FIG. 2 (step S609).

Figure 19:
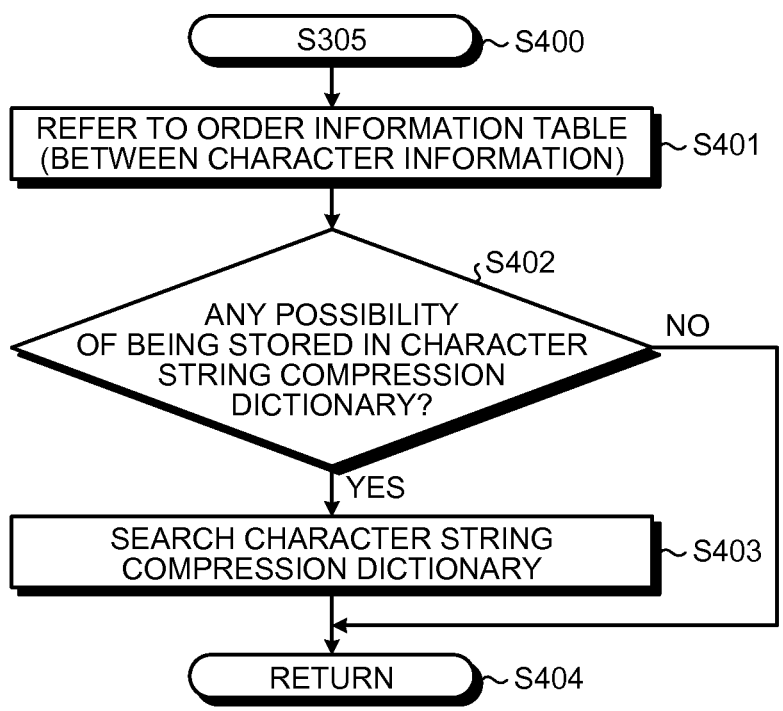
FIG. 19 illustrates an example of a flowchart of a portion of the conversion process according to the second embodiment.

Moreover, in the second embodiment, as illustrated in FIG. 14, the procedure of the process of converting character strings to compression codes is different. The conversion procedure in the second embodiment changes a portion of the conversion procedure illustrated in FIGS. 11 to 13. FIG. 19 illustrates an example of a flowchart of a portion of the conversion process according to the second embodiment.

When the process of step S305 of FIG. 11 is performed (step S400), the control unit 111 causes the reference unit 113 to refer to the order information table T4 (step S401). The reference unit 113 refers to the order information table T4 based on the position on the character string, of the character information included in the character string stored at the i-th storage position of the storage area L1. Moreover, which position in which the character string will be referred to is defined by the definition information used when generating the order information table T4.

An example of the process will be described using the order information table T41. For example, when the order information table T41 is referred to based on the character string "川崎市 (Kawasaki-shi)", it is determined whether the character information "川 (kawa)" is present at the first character" based on the order information table T41. That is, the presence information of the first order of the record of the character information "川 (kawa)" is identified. In this case, the presence information is "1" and represents "Present". The reference unit 113 performs the same process with respect to items of character information "崎 (saki)" and "市 (shi)".

When the process of step S401 is performed, the control unit 111 determines whether there is a possibility that a character string is stored in the character string compression dictionary T1 based on the reference result of the reference unit 113 (step S402). That is, the control unit 111 determines whether any one of combinations of the character information for which the order information table T4 has been referred to and a position in the character string represents "Present". When it is determined in step S402 that there is a possibility that a character string is stored in the character string compression dictionary T1 (step S402: YES), the control unit 111 causes the searching unit 114 to search the character string compression dictionary T1. That is, when any one of combinations of the character information for which the order information table T4 has been referred to and a position in the character string represents "Present," the control unit 111 causes the searching unit 114 to perform searching. When the searching of the character string compression dictionary T1 is performed, the control unit 111 returns to the process of step S306 of FIG. 11 (step S404). On the other hand, when there is not a possibility that the character string is stored in the character string compression dictionary T1 (step S402: NO), the control unit 111 returns to the process of step S306 of FIG. 11 without causing the character string compression dictionary to be searched.

As described above, in the second embodiment, it is possible to suppress unnecessary searching of the character string compression dictionary T1 even a character string that is not registered in the character string compression dictionary T1.

[c] Third Embodiment

A compression process according to a third embodiment is also performed by the computer 1 illustrated in FIG. 1.

Figure 20:
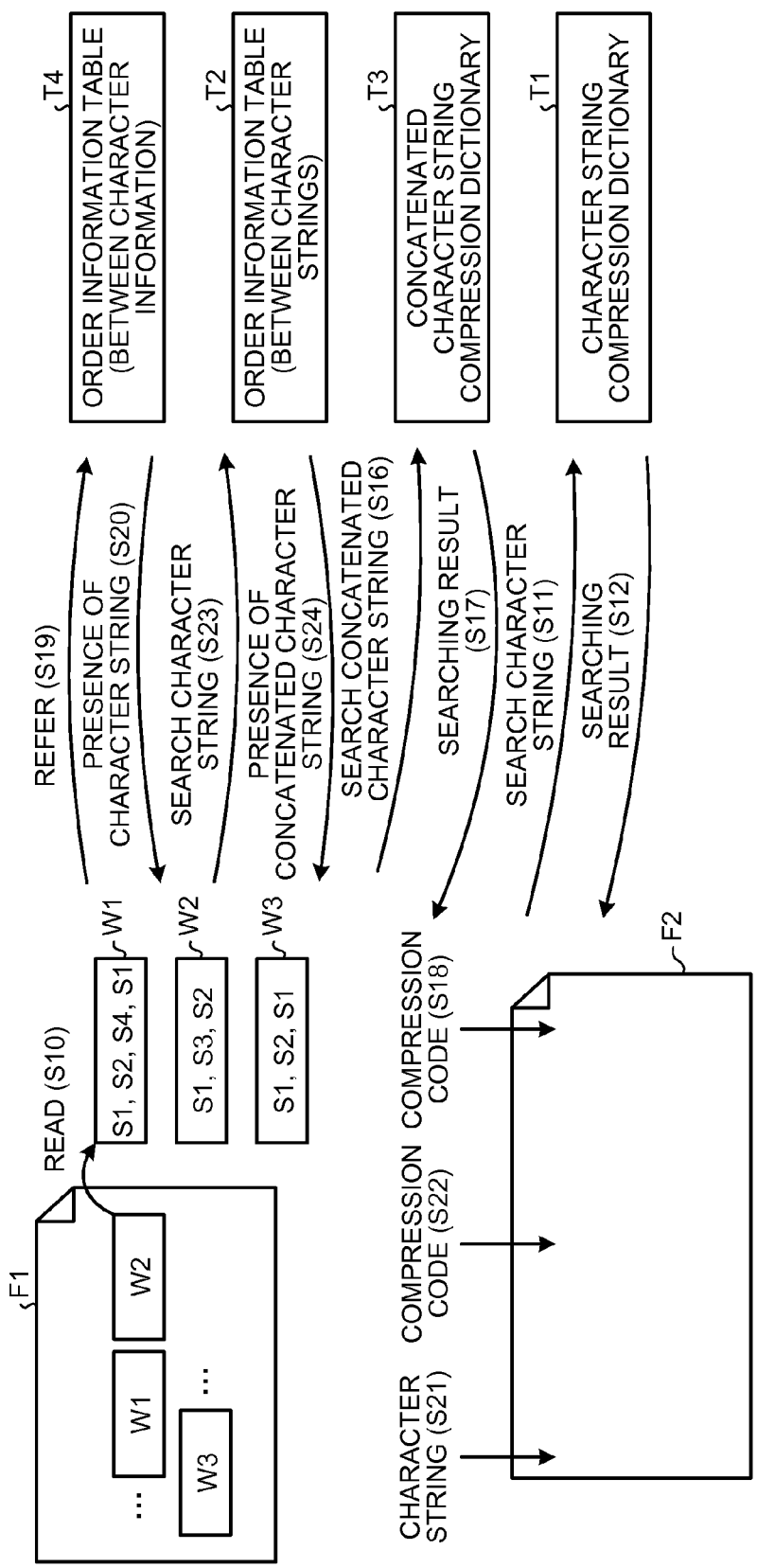
FIG. 20 illustrates an example of a compression process according to a third embodiment.

FIG. 20 illustrates an example of the compression process according to the third embodiment. In the third embodiment, the control unit 111 causes the order information table T4 to be referred a plurality of times (step S19 and step S20), and when the reference result shows that there is a possibility that successive character strings are included in the character string compression dictionary T1, the control unit 111 causes the order information table T2 to be referred based on the successive character strings (step S23 and step S24). That is, the control unit 111 determines whether a character string is registered in the concatenated character string compression dictionary T3 (step S16 and step S17) by skipping the searching of the character string compression dictionary T1 and causes the character string compression dictionary T1 to be searched when a character string is not included in the concatenated character string compression dictionary T3 (step S11 and step S12).

As the number of concatenated character strings registered in the concatenated character string compression dictionary T3 increases, the possibility that the concatenated character string compression dictionary T3 and the character string compression dictionary T1 are searched redundantly also increases. According to the third embodiment, it is possible to suppress the character string compression dictionary T1 from being searched even when a character string is registered in the concatenated character string compression dictionary T3.

Hereinafter, the compression process according to the third embodiment will be described in further detail. Similarly to the second embodiment, the process of step S109 is performed subsequently to the process of step S101 (FIG. 17). As described with reference to FIG. 20, the procedure of the process of converting character strings to compression codes according to the third embodiment changes a portion of the procedure illustrated in FIGS. 11 to 13.

Figure 21:
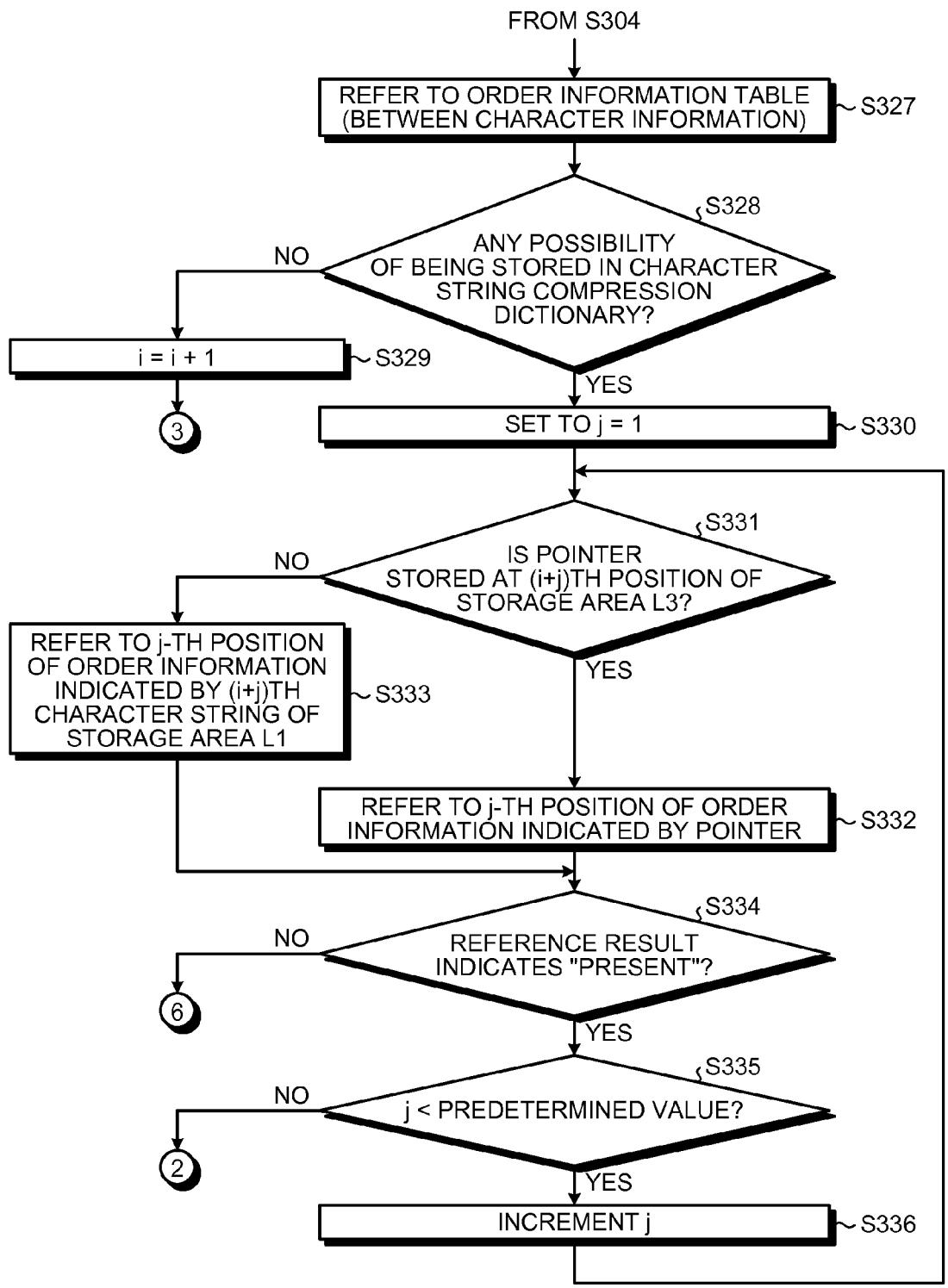
FIG. 21 illustrates an example of a flowchart of a portion of a conversion process according to the third embodiment.
Figure 22:
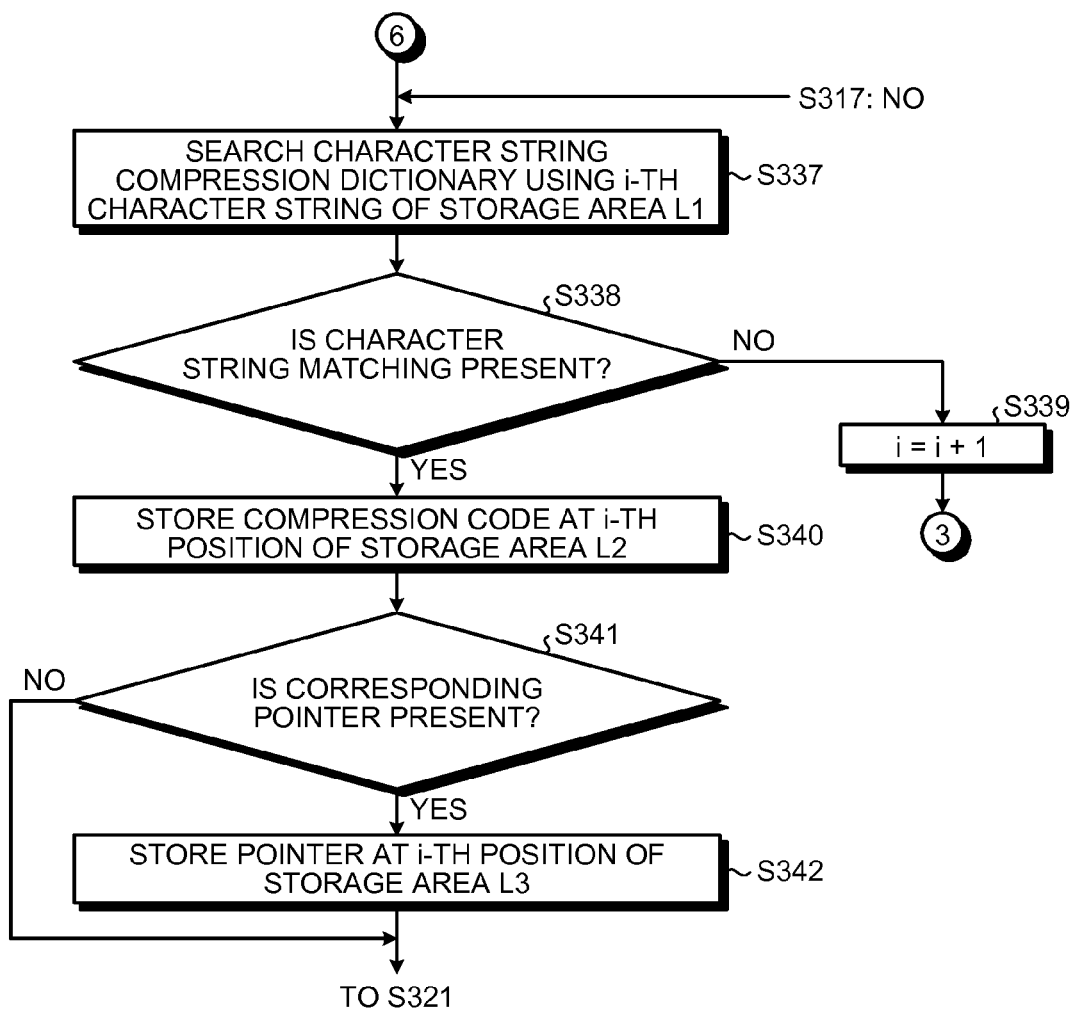
FIG. 22 illustrates an example of a flowchart of a portion of the conversion process according to the third embodiment.

FIGS. 21 and 22 illustrate an example of a flowchart of a portion of the conversion process according to the third embodiment. When the process of step S304 illustrated in FIG. 11 is performed, the control unit 111 causes the reference unit 113 to refer to the order information table T4 (step S327). This process is the same as that of step S401 illustrated in FIG. 19. The reference unit 113 refers to the order information table T4 based on the position on the character string, of the character information included in the character string stored at the i-th storage position of the storage area L1. The control unit 111 determines whether there is a possibility that a character string stored at the i-th storage position of the storage area L1 is stored in the character string compression dictionary T1 based on the reference result of the reference unit 113 (step S328). In this case, the same determination basis as step S402 of FIG. 19 is used.

When there is not a possibility that the character string is stored in the character string compression dictionary T1 (step S328: NO), the control unit 111 assigns i=i+1 ("=" is an assignment operator) to the counter value i (step S329). When the process of step S329 is performed, the control unit 111 performs the process of step S302 illustrated in FIG. 1.

When there is a possibility that the character string is stored in the character string compression dictionary T1 (step S328: YES), the control unit 111 assigns j=1 ("=" is an assignment operator) to the counter value j (step S330). Subsequently, the control unit 111 determines whether a pointer is present at the (i+j)th storage position of the storage area L3 (step S331). It is determined in step S331 that when the pointer is present (step S331: YES), the control unit 111 causes the reference unit 113 to refer to the order information table T2 based on the pointer (step S332). It is determined in step S331 that when the pointer is not present (step S331: NO), the control unit 111 causes the reference unit 113 to refer to the order information table T2 based on the (i+j)th character string in the storage area L1 (step S333). In steps S332 and S333, the reference unit 113 refers to the order information of the j-th character string in the concatenated character string.

The control unit 111 determines whether the reference result of step S332 or step S333 represents "Present" (step S334). When the reference result represents "Present" (step S334: YES), the control unit 111 determines whether the counter value j is smaller than a predetermined value (step S335). When the counter value j is a predetermined value or more (step S335: NO), the control unit 111 returns to the process of step S316 of FIG. 13. When the counter value j is smaller than the predetermined value (step S335: YES), the control unit 111 increments the counter value j (assignment of j=j+1) (step S336) and performs the process of step S331.

It is determined in step S334 that when the reference result represents "Absent" (step S334: NO), the control unit 111 compresses the i-th character string in the storage area L1. First, the control unit 111 causes the searching unit 114 to search the character string compression dictionary T1 using the i-th character string in the storage area L1 (step S337). The control unit 111 determines whether a matching character string was specified in the character string compression dictionary T1 as the searching result of the searching unit 114 (step S338). When the character string is not included in the character string compression dictionary T1 (step S338: NO), the control unit 111 increments the counter value i (assignment of i=i+1) (step S339) and performs the process of step S302 of FIG. 11.

When a matching character string is specified in the character string compression dictionary T1 (step S338: YES), the control unit 111 stores a compression code correlated with the specified character string in the character string compression dictionary T1 at the i-th storage position of the storage area L2 (step S340). Further, the control unit 111 determines whether a pointer is correlated with the specified character string in the character string compression dictionary T1 (step S341). When the pointer is correlated (step S341: YES), the control unit 111 stores the pointer at the i-th storage position of the storage area L3 (step S342). When the process of step S342 is performed or when the pointer is not correlated with the specified character string in the character string compression dictionary T1 (step S341: NO), the control unit 111 returns to the process of step S321 illustrated in FIG. 13.

[d] Fourth Embodiment

For example, a list of similar data may be included in a database. Further, the number of character strings included in each of the items of listed data may be fixed. In such a case, when it is checked whether a character string is identical to a concatenated character string, the checking may performed for respective items of data including a plurality of character strings rather than comparing character strings one by one. In the fourth embodiment, for example, character strings are read successively and are checked whether each character string is stored in the concatenated character string compression dictionary T3 earlier than searching the character string compression dictionary T1 based on the character string.

Figure 23:
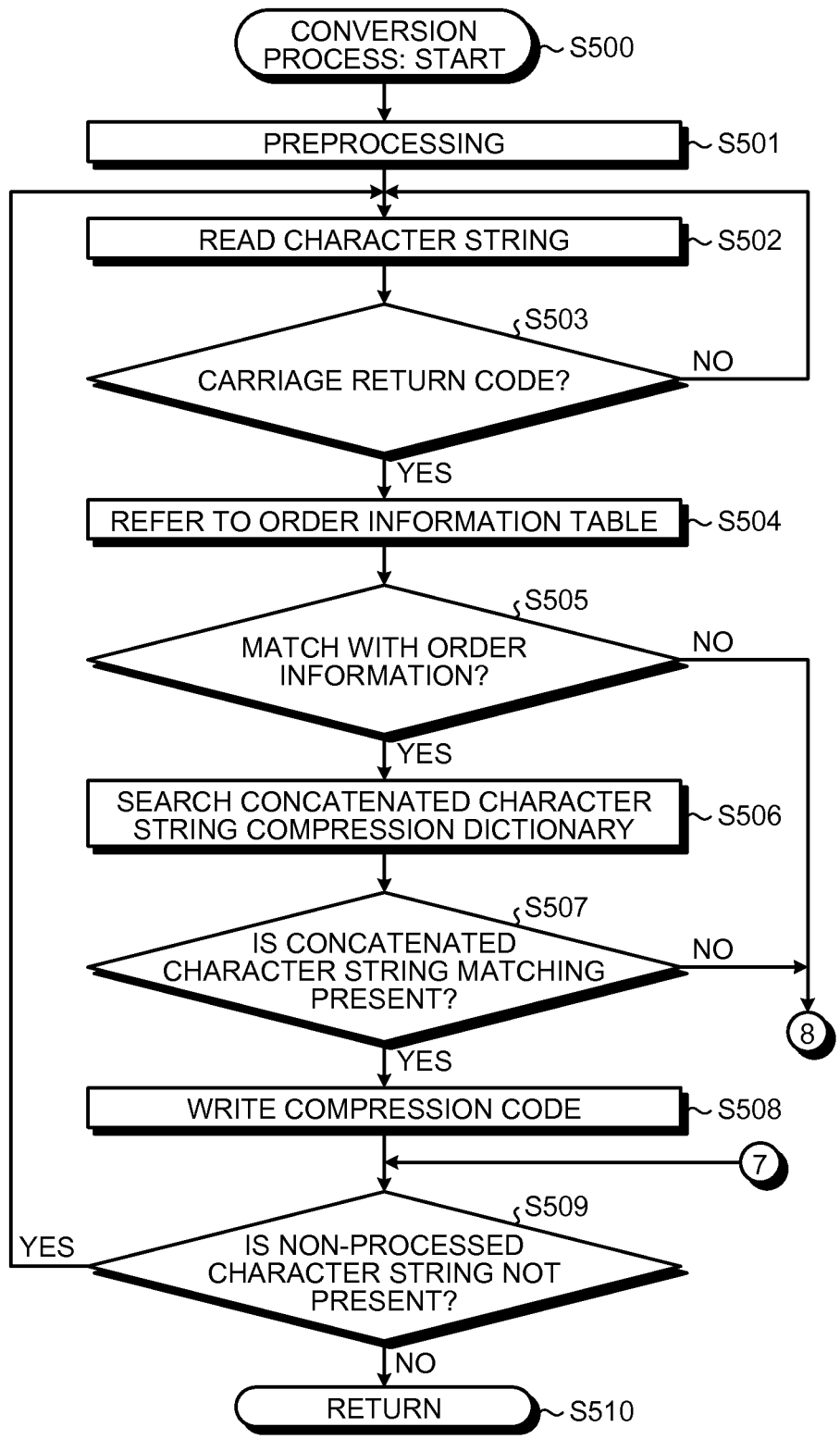
FIG. 23 illustrates an example of a flowchart of a conversion process according to a fourth embodiment.
Figure 24:
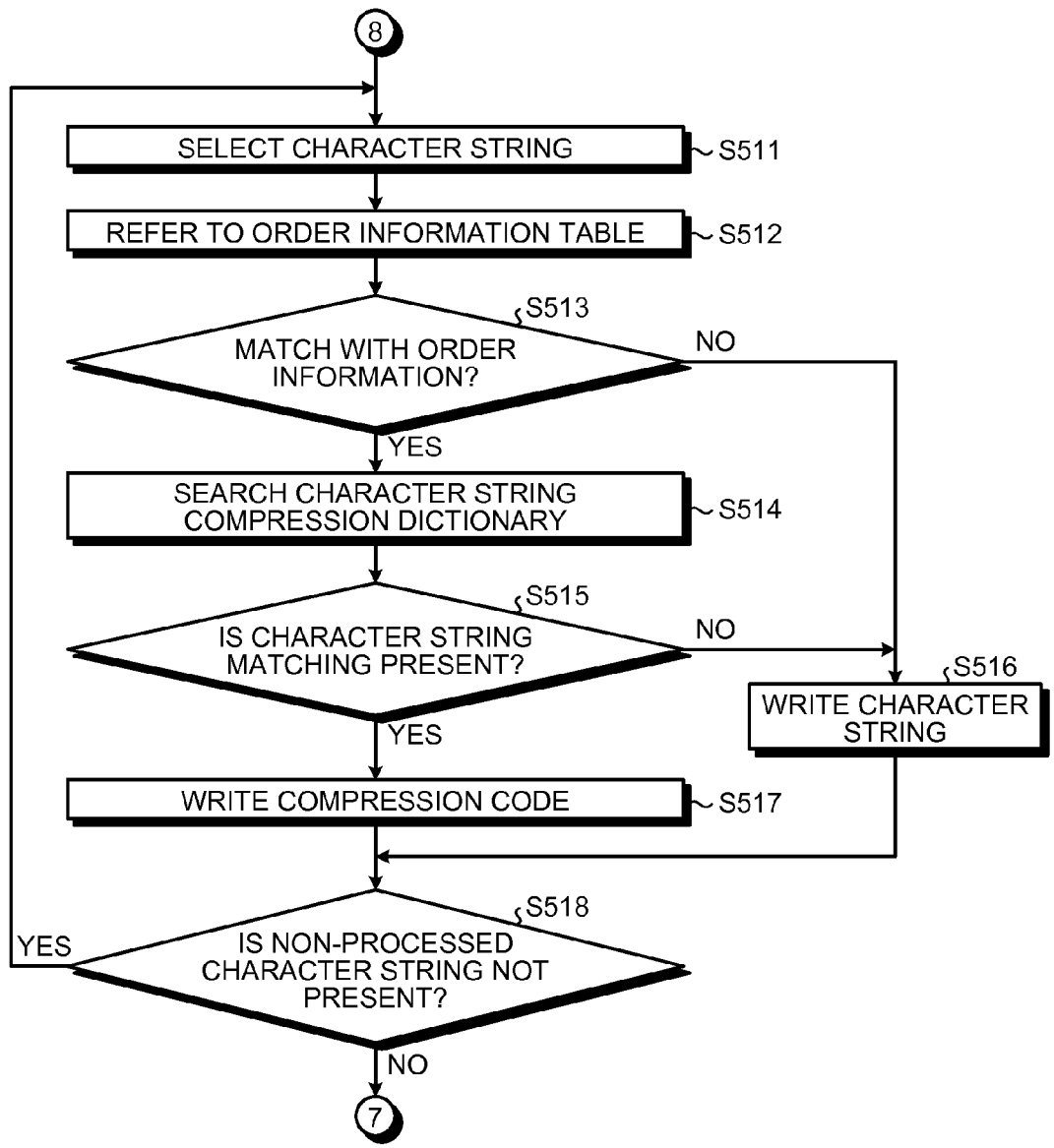
FIG. 24 illustrates an example of a flowchart of the conversion process according to the fourth embodiment.

FIGS. 23 and 24 illustrate an example of a flowchart of a conversion process according to the fourth embodiment. When the conversion process starts (step S500), the control unit 111 executes preprocessing (step S501). The process of step S501 is the same as the process of step S301 illustrated in FIG. 11, for example. Subsequently, the control unit 111 reads character strings from the compression target file F1 (step S502) and returns to the process of step S502 until a carriage return code is read (step S503: NO). When a carriage return code is read (step S503: YES), the control unit 111 causes the reference unit 113 to refer to the order information table T2 (step S504). The reference unit 113 refers to the order information included in the order information table T2 with respect to each of a plurality of character strings read repeatedly in step S502. The control unit 111 determines whether each of the plurality of read character strings matches the order information referred to by the reference unit 113 (step S505). When all of the plurality of character strings match the order information (step S505: YES), the control unit 111 causes the searching unit 114 to search the concatenated character string compression dictionary T3 using the plurality of read character strings (step S506). The control unit 111 determines whether a concatenated character string that matches the plurality of read character strings is registered in the concatenated character string compression dictionary T3 in accordance with the searching result of the searching unit 114 (step S507). When the matching concatenated character string is registered in the concatenated character string compression dictionary T3 (step S507: YES), the compression code correlated with the registered concatenated character string is written to the writing position of the compressed file F2 (step S508).

When any one of the plurality of character strings read in step S502 does not match the order information (step S505: NO) or when a concatenated character string that matches the plurality of character strings is not present in the concatenated character string compression dictionary T3 (step S507: NO), the control unit 111 selects one character string from the plurality of character strings (step S511). Subsequently, the control unit 111 causes the reference unit 113 to refer to the order information table T4 with respect to the character information included in the selected character string (step S512). The control unit 111 determines whether the order information matches the referenced character information (step S513). When all items of referenced character information match the order information (step S513: YES), the control unit 111 causes the searching unit 114 to search the character string compression dictionary T1 using the selected character string (step S514). The control unit 111 determines whether a character string that matches the selected character string is present in accordance with the searching result of the character string compression dictionary T1 (step S515). When the matching character string is present (step S515: YES), the control unit 111 writes the compression code correlated with the matching character string in the character string compression dictionary T1 to the writing position of the compressed file F2 (step S517).

When one or more of the items of referenced character information do not match the order information (step S513: NO) or when the matching character string is not present in the character string compression dictionary T1 (step S515: NO), the control unit 111 writes the selected character string in the writing position of the compressed file F2 (step S516).

When the process of step S516 or step S517 ends, it is determined whether a character string that is not selected in step S511 is present in the plurality of character strings read in step S502 (step S518). When the non-selected character string is present (step S518: NO), the control unit 111 performs the process of step S511 again.

When the process of step S508 is performed or when it is determined in step S518 that the non-selected character string is not present (step S518: YES), the control unit 111 determines whether a non-processed character string is present in the compression target file F1 (step S509). When the non-processed character string is not present (step S509: YES), the control unit 111 ends the conversion process (step S510). When the non-processed character string is present (step S509: NO), the control unit 111 performs the process of step S502 again.

Figure 25:
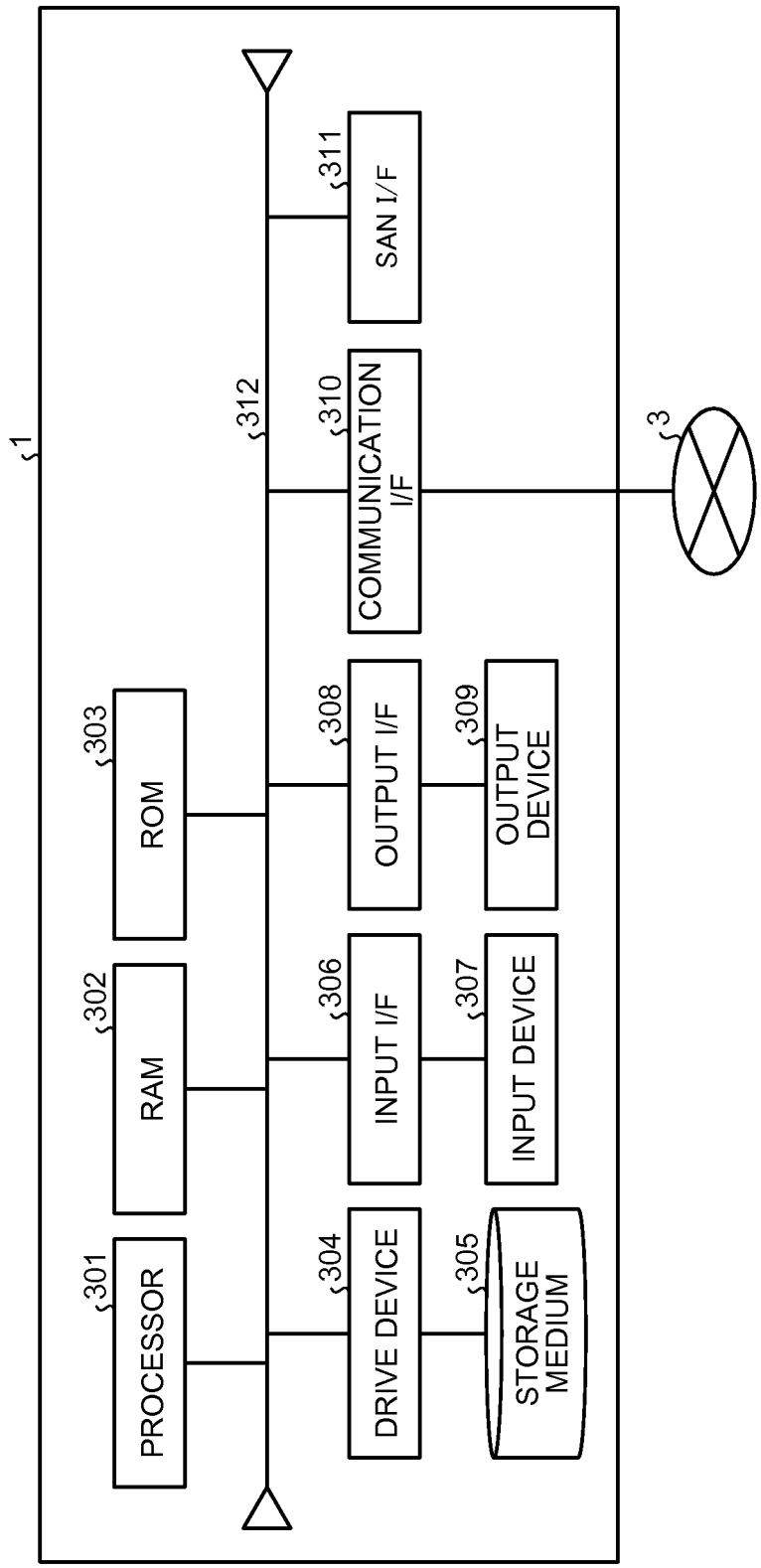
FIG. 25 illustrates an example of a hardware configuration of a computer 1.

FIG. 25 illustrates an example of a hardware configuration of the computer 1 used in the first to fourth embodiments. The computer 1 includes a processor 301, a random access memory (RAM) 302, a read only memory (ROM) 303, a drive device 304, a storage medium 305, an input interface (I/F) 306, an input device 307, an output interface (I/F) 308, an output device 309, a communication interface (I/F) 310, a storage area network (SAN) interface (I/F) 311, and a bus 312, for example. The respective hardware components are connected by the bus 312.

The RAM 302 is a readable and writable memory device, and for example, a semiconductor memory such as a static RAM (SRAM) or a dynamic RAM (DRAM) or a flash memory which is not a RAM. The ROM 303 includes a programmable ROM (PROM), or the like. The drive device 304 is a device that reads or writes information recorded in the storage medium 305. The storage medium 305 stores information written by the drive device 304. The storage medium 305 is a flash memory such as a hard disk or a solid state drive (SSD) or a storage medium such as a compact disc (CD), a digital versatile disc (DVD), or a blu-ray disc, for example. Moreover, for example, the computer 1 has the drive device 304 and the storage medium 305 which are provided in each of a plurality of storage media.

The input interface 306 is connected to the input device 307 and transfers an input signal received from the input device 307 to the processor 301. The output interface 308 is connected to the output device 309 and causes the output device 309 to output data in accordance with an instruction of the processor 301. The communication interface 310 controls communication via a network 3. The SAN interface 311 controls communication with a storage device connected to the computer 1 by a storage area network.

The input device 307 is a device that transmits an input signal in accordance with an operation. The input signal is a key device such as a keyboard or a button provided on the body of the computer 1, or a pointing device such as a mouse or a touch panel, for example. The output device 309 is a device that outputs information in accordance with control of the computer 1. The output device 309 is an image output device (display device) such as a display or an audio output device such as a speaker, for example. Moreover, for example, an input/output device such as a touch screen is used as the input device 307 and the output device 309. Moreover, the input device 307 and the output device 309 may be integrated with the computer 1 and may be devices connected to the computer 1 from the outside rather than being included in the computer 1.

For example, the processor 301 reads a program stored in the ROM 303 or the storage medium 305 into the RAM 302 and performs the process of the compression unit 11 or the decompression unit 12 in accordance with the procedure of the read program. In this case, the RAM 302 is used as a work area of the processor 301. The function of the storage unit 13 is realized when the ROM 303 and the storage medium 305 stores program files (an application program 24, middleware 23, an OS 22, and the like which will be described later) and data files (a compression target data file, a compressed file, a decompression target data file, a decompressed file, and the like) and the RAM 302 is used as the work area of the processor 301. The program read by the processor 301 will be described with reference to FIG. 26.

Figure 26:
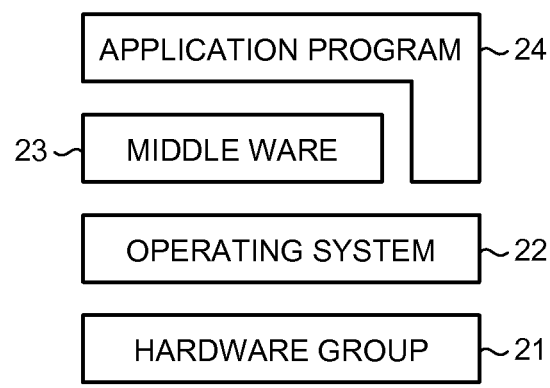
FIG. 26 illustrates an example of a program configuration of the computer 1.

FIG. 26 illustrates an example of a program configuration of the computer 1. In the computer 1, an operating system (OS) 22 that controls a hardware group 21 illustrated in FIG. 25 operates. The processor 301 operates in accordance with the procedure of the OS 22 whereby the hardware group 21 is controlled and managed. As a result, the hardware group 21 executes processes in accordance with the application program 24 and the middleware 23. Further, in the computer 1, the middleware 23 or the application program 24 is read into the RAM 302 and executed by the processor 301.

The processor 301 performs processes based on the compression function included in the middleware 23 or the application program 24 (the OS 22 controls the hardware group 21 to perform these processes), whereby the function of the compression unit 11 is realized. Moreover, the processor 301 performs processes based on the decompression function included in the middleware 23 or the application program 24 (the OS 22 controls the hardware group 21 to perform these processes), whereby the function of the decompression unit 12 is realized. The compression function and the decompression function may be defined in the application program 24 itself and may be the function of the middleware 23 which is executed by being invoked with the application program 24.

Figure 27:
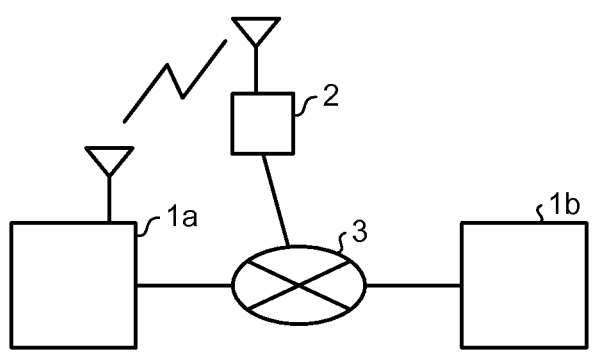
FIG. 27 illustrates an example of a system configuration.

FIG. 27 illustrates an example of a configuration of devices in a system that includes the computer of the first to fourth embodiments. The system of FIG. 27 includes a computer 1a, a computer 1b, a base station 2, and a network 3. The computer 1a is connected to the network 3 connected to the computer 1b wirelessly or by cables.

The compression unit 11 and the decompression unit 12 illustrated in FIG. 1 may be included in any one of the computers 1a and 1b illustrated in FIG. 27. The computer 1b may include the compression unit 11 illustrated in FIG. 1 and the computer 1a may include the decompression unit 12. Alternatively, the computer 1b may include the compression unit 11 and the computer 1a may include the decompression unit 12. Moreover, both the computer 1a and the computer 1b may include the compression unit 11 and the decompression unit 12.

According to one aspect, it is possible to suppress the amount of processing performed redundantly for the searching of a character string group and the searching of a set of combinations of character strings.

All examples and conditional language recited herein are intended for pedagogical purposes of aiding the reader in understanding the invention and the concepts contributed by the inventors to further the art, and are not to be construed as limitations to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A non-transitory computer-readable recording medium having stored therein a compression program that causes a computer to execute a process comprising:
reading a plurality of character strings from a compression target file;
examining order information whether there are any concatenated character strings that contain a certain character string in the plurality of character strings with an order of the certain character string, in a compression dictionary, the compression dictionary correlating a plurality of concatenated character strings with a plurality of compression codes respectively, each of the plurality of concatenated character strings include a plurality of character strings, the order information indicating whether there is a specific character string in the compression dictionary with an order of the specific character string; and
searching the compression dictionary utilizing the plurality of character strings when the order information indicates that one or more concatenated character strings include the certain character string.

2. The non-transitory computer-readable recording medium according to claim 1, wherein
each of character strings included in the concatenated character string is a character string correlated with a compression code by another compression dictionary, and
the process includes performing a compression process on one or more character strings of the plurality of character strings based on the other compression dictionary when the order information indicates that one or more concatenated character strings do not include the certain character string.

3. The non-transitory computer-readable recording medium according to claim 2, wherein
the examining includes, when the compression process is performed based on the other compression dictionary, and a compression target character string includes certain character information in a middle position of the certain character string, referring to presence information indicating whether one or more character strings of the character strings included in the other compression dictionary include the certain character information at a middle position of the certain character string, the searching includes searching the other compression dictionary using the compression target character string unless the presence information indicates that none of the character strings included in the other compression dictionary includes the certain character information at the middle position of the certain character string, and the process further includes compressing the compression target character string in accordance with a searching result of the other compression dictionary.

4. The non-transitory computer-readable recording medium according to claim 3, wherein the process further includes: performing control such that the referring of the presence information and the searching of the other compression dictionary are executed earlier than the referring of the order information; and suppressing the referring of the order information when the presence information indicates that any of the character strings included in the other compression dictionary does not include the certain character information at the middle position of the certain character string or when it was not possible to specify the compression target character string by searching the other compression dictionary.

5. The non-transitory computer-readable recording medium according to claim 4, wherein the process further includes acquiring a pointer indicating a storage position of order information corresponding to the specified character string, stored in correlation with the character string specified at the searching in the other compression dictionary, and the referring includes referring of the order information based on the acquired pointer.

6. The non-transitory computer-readable recording medium according to claim 4, wherein the performing control includes performing control such that referring of another order information indicating whether one or more of the concatenated character strings included in the compression dictionary include the compression target character string at a certain position in the concatenated character string is performed earlier than the searching of the other compression dictionary when the presence information indicates that one or more of the character strings included in the other compression dictionary include the certain character information at the certain position in the character string.

7. The non-transitory computer-readable recording medium according to claim 2, wherein the process further includes, when a concatenated character string that matches the plurality of character strings is specified at the searching of the other compression dictionary based on the plurality of character strings, writing a compression code correlated with the specified concatenated character string in the compression dictionary to a compressed file.

8. A compression method comprising:

reading a plurality of character strings from a compression target file;

examining order information whether there are any concatenated character strings that contain a certain character string in the plurality of character strings with an order of the certain character string, in a compression dictionary, the compression dictionary correlating a plurality of concatenated character strings with a plurality of compression codes respectively, each of the plurality of concatenated character strings include a plurality of character strings, the order information indicating whether there is a specific character string in the compression dictionary with an order of the specific character string; and searching the compression dictionary utilizing the plurality of character strings when the order information indicates that one or more concatenated character strings include the certain character string.

9. A compression device comprising:

a processor configured to execute a process including:

reading a plurality of character strings from a compression target file;

examining order information whether there are any concatenated character strings that contain a certain character string in the plurality of character strings with an order of the certain character string, in a compression dictionary, the compression dictionary correlating a plurality of concatenated character strings with a plurality of compression codes respectively, each of the plurality of concatenated character strings include a plurality of character strings, the order information indicating whether there is a specific character string in the compression dictionary with an order of the specific character string; and searching the compression dictionary utilizing the plurality of character strings when the order information indicates that one or more concatenated character strings include the certain character string.

* * * * *